(12) United States Patent
van Dal et al.

(10) Patent No.: US 10,937,908 B2
(45) Date of Patent: Mar. 2, 2021

(54) THIN-SHEET FINFET DEVICE

(71) Applicant: Taiwan Semiconductor Manufacturing Company, Ltd., Hsinchu (TW)

(72) Inventors: Mark van Dal, Linden (BE); Martin Christopher Holland, Bertem (BE); Matthias Passlack, Huldenberg (BE)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 301 days.

(21) Appl. No.: 15/648,718

(22) Filed: Jul. 13, 2017

(65) Prior Publication Data

US 2017/0317206 A1  Nov. 2, 2017

Related U.S. Application Data

(62) Division of application No. 14/304,695, filed on Jun. 13, 2014, now Pat. No. 9,711,647.

(51) Int. Cl.
*H01L 29/66* (2006.01)
*H01L 27/092* (2006.01)
(Continued)

(52) U.S. Cl.
CPC ........ *H01L 29/785* (2013.01); *H01L 27/0924* (2013.01); *H01L 27/10826* (2013.01);
(Continued)

(58) Field of Classification Search
CPC ............. H01L 29/785; H01L 29/66795; H01L 29/1054; H01L 29/1606; H01L 29/0673; H01L 27/0924; H01L 27/10826
See application file for complete search history.

(56) References Cited

U.S. PATENT DOCUMENTS 8,304,760 B2 * 11/2012 Chen ................... H01L 29/1606
257/213
8,604,518 B2   12/2013 Bhuwalka et al.
(Continued)

FOREIGN PATENT DOCUMENTS

CN         103503147 A       8/2014
KR     1020050049866         5/2005
(Continued)

OTHER PUBLICATIONS

Notice of Allowance of Patent dated Nov. 16, 2016, Korean Patent Office, for Application No. 10-2014-0193071, 4 pages Nov. 16, 2016.
(Continued)

*Primary Examiner* — Michael M Trinh
(74) *Attorney, Agent, or Firm* — Haynes and Boone, LLP

(57) ABSTRACT

Various methods for fabricating non-planar integrated circuit devices, such as FinFET devices, are disclosed herein. An exemplary method includes forming a rib structure extending from a substrate; forming a two-dimensional material layer (including, for example, transition metal dichalcogenide or graphene) on the rib structure and the substrate; patterning the two-dimensional material layer, such that the two-dimensional material layer is disposed on at least one surface of the rib structure; and forming a gate on the two-dimensional material layer. In some implementations, a channel region, a source region, and a drain region are defined in the two-dimensional material layer. The channel region is disposed between the source region and the drain region, where the gate is disposed over the channel region. In some implementations, the patterning includes removing the two-dimensional material layer disposed on a top surface of the substrate and/or disposed on a top surface of the rib structure.

20 Claims, 42 Drawing Sheets

(51) Int. Cl.
*H01L 29/78* (2006.01)
*H01L 29/16* (2006.01)
*H01L 29/06* (2006.01)
*H01L 27/108* (2006.01)
*H01L 29/10* (2006.01)

(52) U.S. Cl.
CPC ...... *H01L 29/0673* (2013.01); *H01L 29/1054* (2013.01); *H01L 29/1606* (2013.01); *H01L 29/66795* (2013.01)

(56) References Cited

U.S. PATENT DOCUMENTS

| | | | |
|---|---|---|---|
| 2005/0116218 A1 | 6/2005 | Yang | |
| 2009/0020764 A1* | 1/2009 | Anderson | H01L 29/1606 257/77 |
| 2010/0032409 A1* | 2/2010 | Hong | B82Y 10/00 216/41 |
| 2011/0017390 A1* | 1/2011 | Blake | B81C 99/008 156/247 |
| 2012/0168723 A1 | 7/2012 | Park | |
| 2013/0146846 A1* | 6/2013 | Adkisson | H01L 29/66045 257/27 |
| 2013/0175506 A1* | 7/2013 | Heo | H01L 29/42392 257/29 |
| 2014/0015015 A1* | 1/2014 | Krivokapic | H01L 21/02527 257/288 |
| 2014/0017883 A1* | 1/2014 | Dal | H01L 21/02378 438/478 |
| 2014/0061590 A1* | 3/2014 | Lee | H01L 29/1606 257/29 |
| 2014/0319452 A1* | 10/2014 | Seabaugh | H01L 29/1606 257/9 |
| 2015/0303299 A1* | 10/2015 | Chang | H01L 29/7827 257/29 |

FOREIGN PATENT DOCUMENTS

| | | |
|---|---|---|
| KR | 1020120076297 | 7/2012 |
| KR | 1020120118566 | 10/2012 |
| KR | 1020130101810 | 9/2013 |

OTHER PUBLICATIONS

G Vellianitis et al., High Crystalline Quality Ge Grown by MOCVD Inside Narrow Shallow Trench Isolatin Defined on Si(001) Substrates, Journal of Crystal Growth 383 (2013) 9-11, 3 pages. Sep. 11, 2013.

Mjh Van Dal et al., "Demonstration of Scaled Ge P-Channel FinFET Integrated on Si,", Electron Devices Meeting (IEDM), 2012 IEEE International 2012.

Office Action dated Feb. 21, 2016, Korean Patent Office, for Application No. 10-2014-0193071 dated Feb. 21, 2016.

* cited by examiner

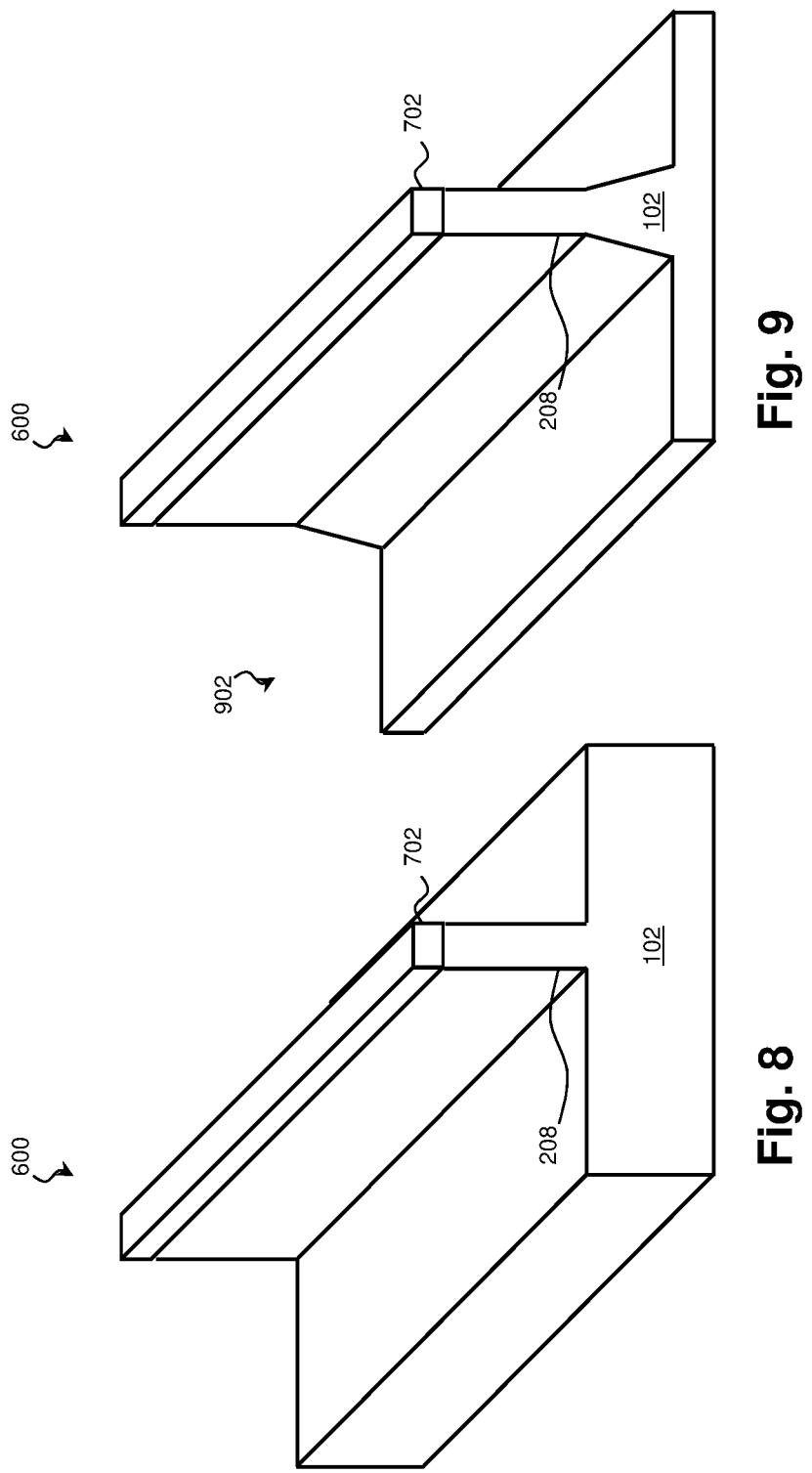

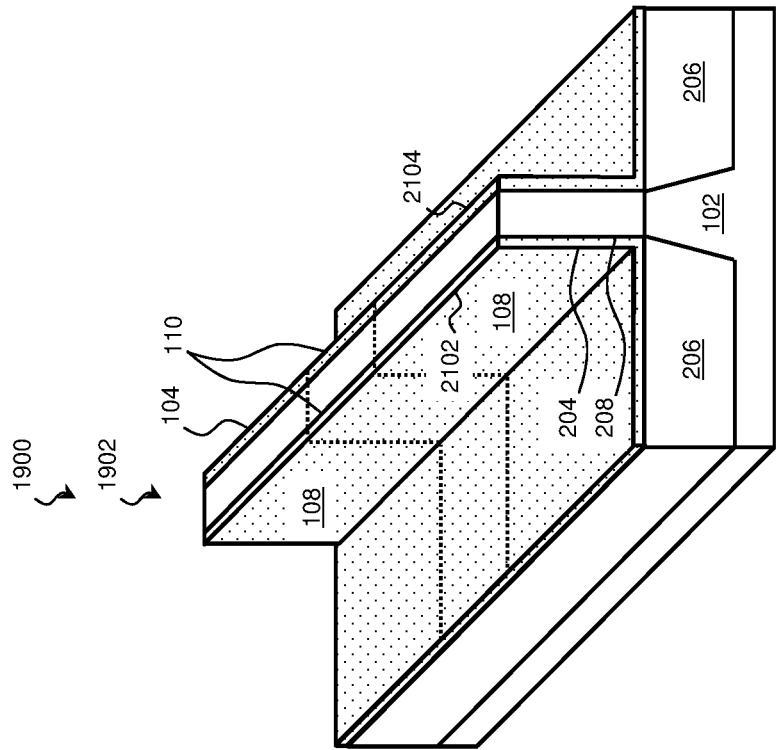
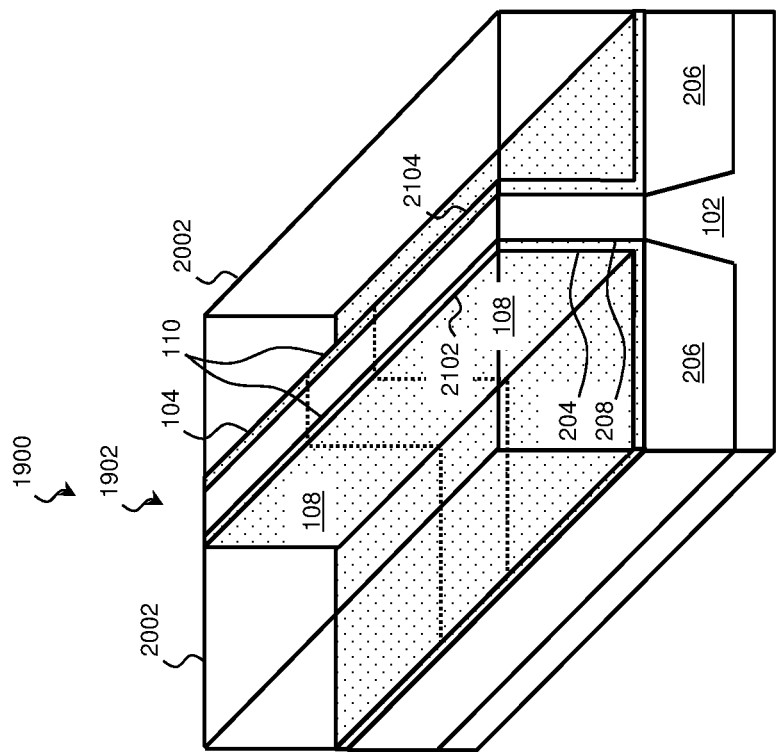

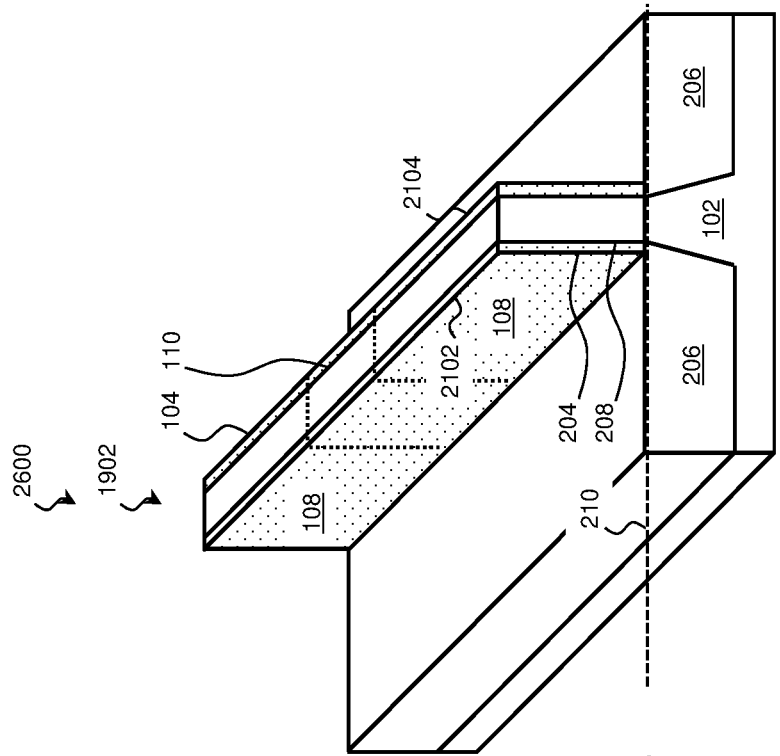
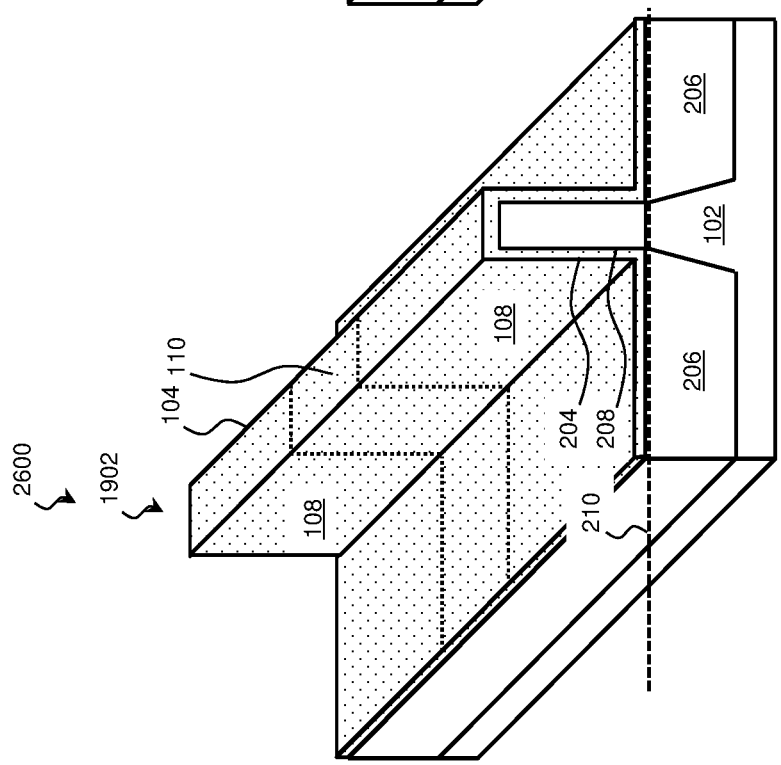

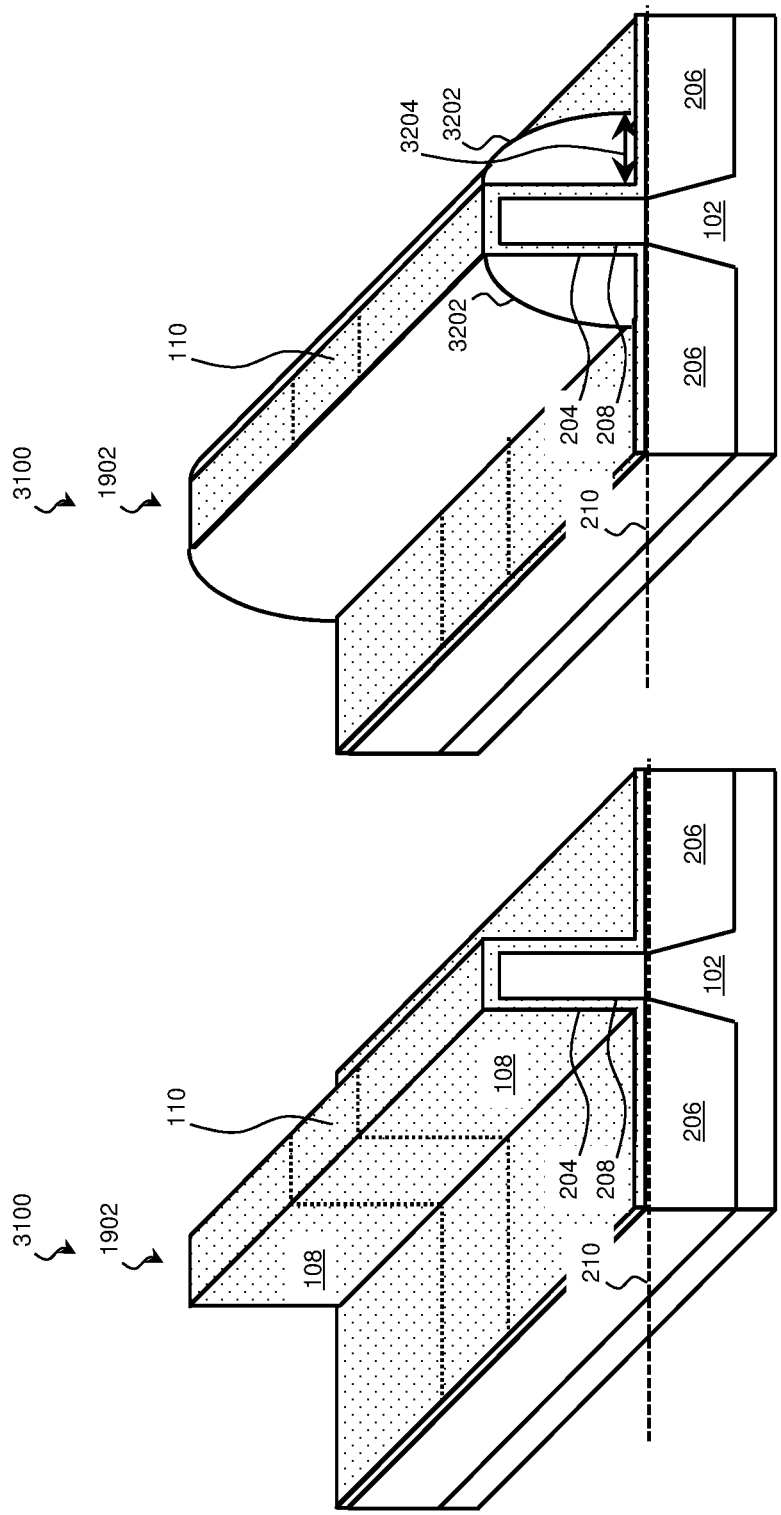

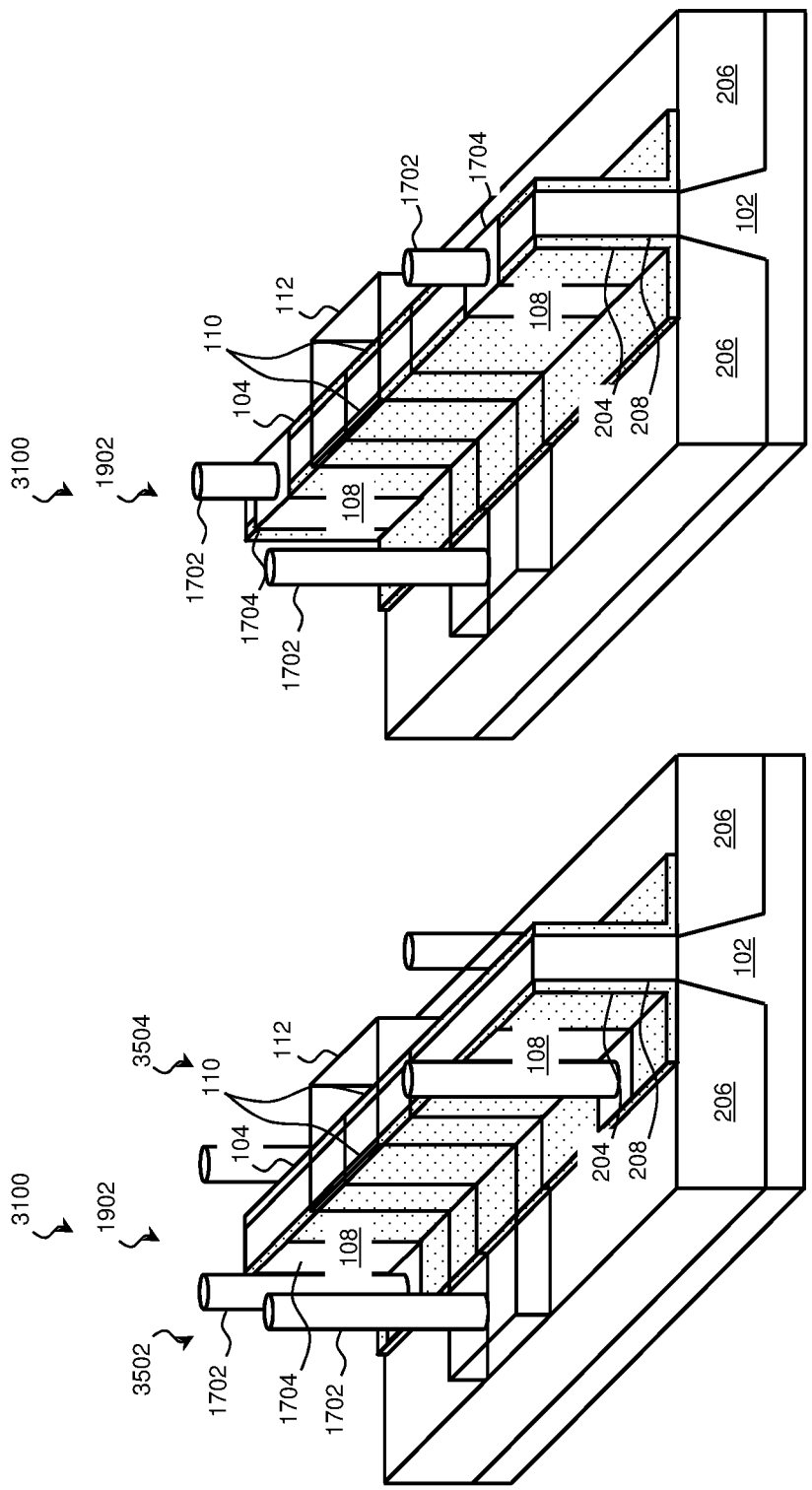

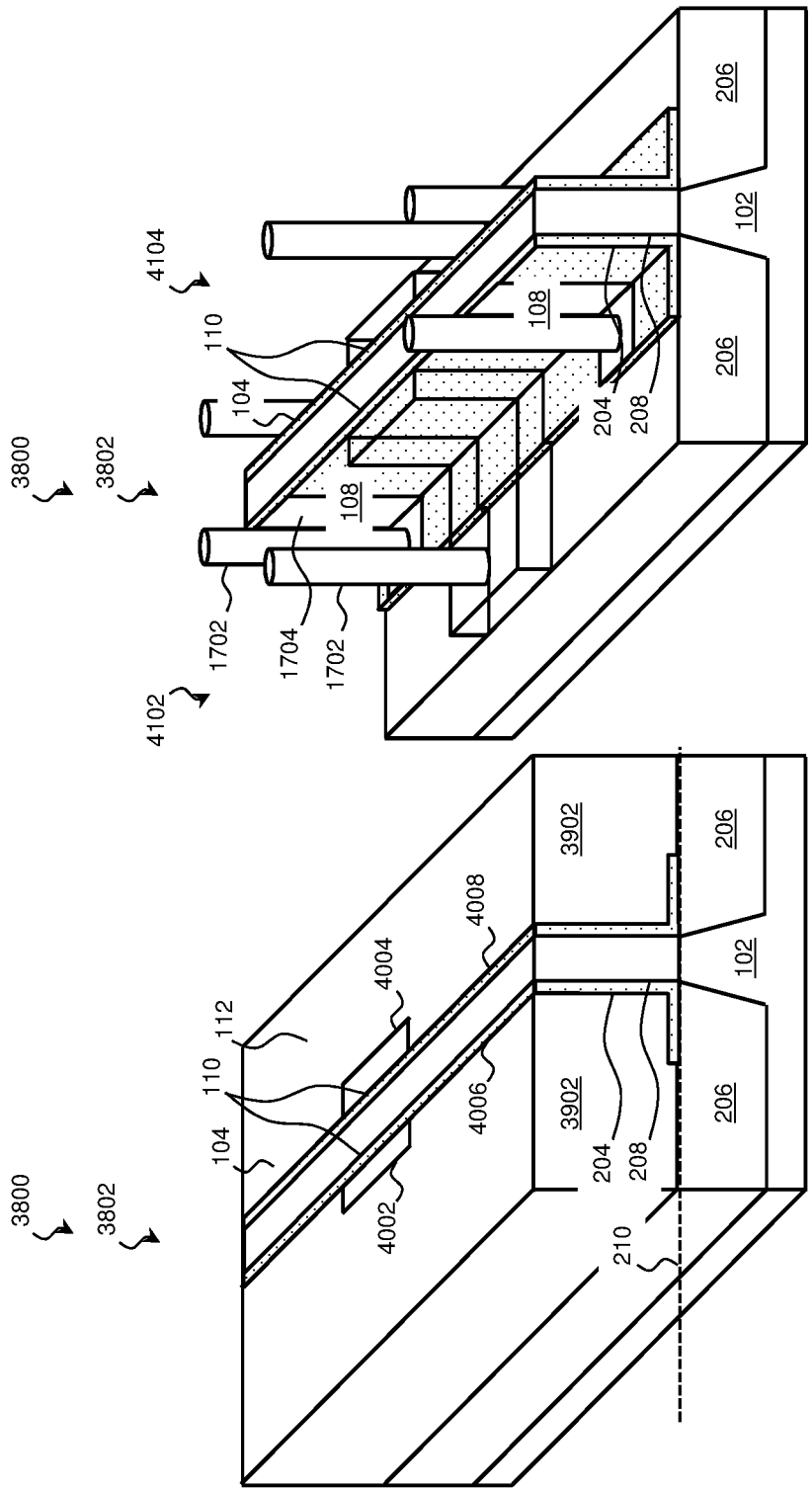

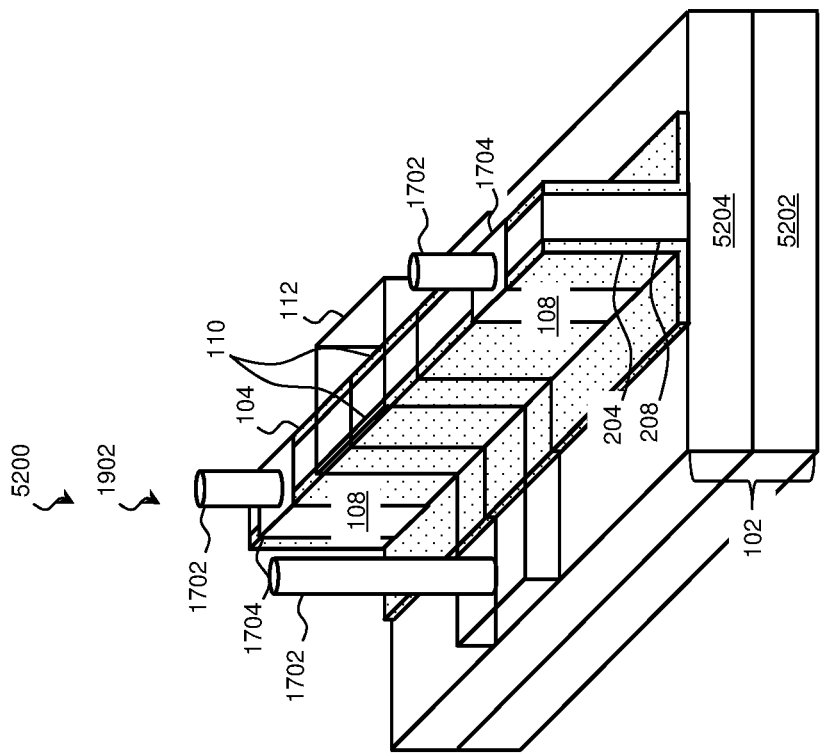
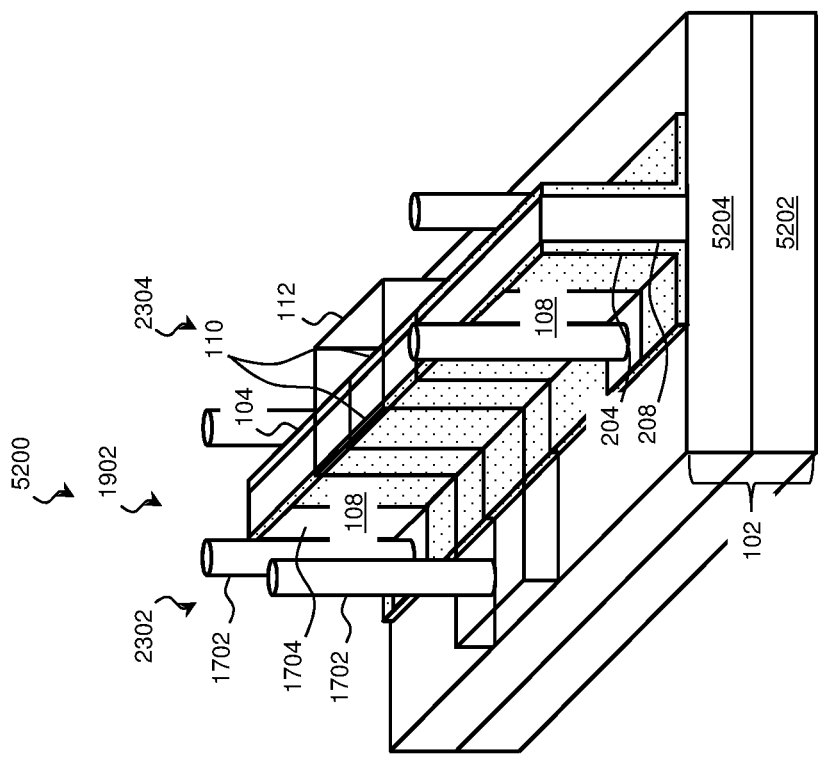
Fig. 60
Fig. 59

THIN-SHEET FINFET DEVICE

This application is a divisional application of U.S. patent application Ser. No. 14/304,695, filed Jun. 13, 2014, now U.S. Pat. No. 9,711,647 the entire disclosure of which is incorporated herein by reference in its entirety.

BACKGROUND

The semiconductor industry has progressed into nanometer technology process nodes in pursuit of higher device density, higher performance, and lower costs. Despite groundbreaking advances in materials and fabrication, scaling planar device such as the conventional MOSFET has proven challenging. To overcome these challenges, circuit designers look to novel structures to deliver improved performance. One avenue of inquiry is the development of three-dimensional designs, such as a fin-like field effect transistor (FinFET). A FinFET can be thought of as a typical planar device extruded out of a substrate and into the gate. A typical FinFET is fabricated with a thin "fin" (or fin structure) extending up from a substrate. The channel of the FET is formed in this vertical fin, and a gate is provided over (e.g., wrapping around) the channel region of the fin. Wrapping the gate around the fin increases the contact area between the channel region and the gate and allows the gate to control the channel from multiple sides. This can be leveraged in a number of way, and in some applications, FinFETs provide reduced short channel effects, reduced leakage, and higher current flow. In other words, they may be faster, smaller, and more efficient than planar devices.

However, because of the complexity inherent in FinFETS and other non-planar devices, fabrication techniques may more closely resemble MEMS (microelectromechanical systems) techniques than conventional planar transistor fabrication. Some planar techniques may be redesigned for non-planar manufacturing. Other techniques are wholly unique to non-planar fabrication. Thus while non-planar devices have already proven suitable for a number of applications, opportunities remain for further advances in device structures, materials, and fabrication techniques. These advances have the potential to deliver further reductions in power and size with improved drive strength and reliability.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 6-15 are perspective views of a portion of a workpiece undergoing a method of forming a trigate FinFET device according to various aspects of the present disclosure.

FIGS. 19-24 are perspective views of a portion of a workpiece undergoing a method of forming a double-gate FinFET device according to various aspects of the present disclosure.

FIGS. 26-29 are perspective views of a portion of a workpiece undergoing a method of forming a double-gate FinFET device according to various aspects of the present disclosure.

FIGS. 31-36 are perspective views of a portion of a workpiece undergoing a method of forming a double-gate FinFET device according to various aspects of the present disclosure.

FIGS. 38-41 are perspective views of a portion of a workpiece undergoing a method of forming a double-device FinFET according to various aspects of the present disclosure.

FIGS. 58-69 are perspective views of a portion of a workpiece having thin-film FinFETs formed thereupon according to various aspects of the present disclosure.

DETAILED DESCRIPTION

Figure 2:
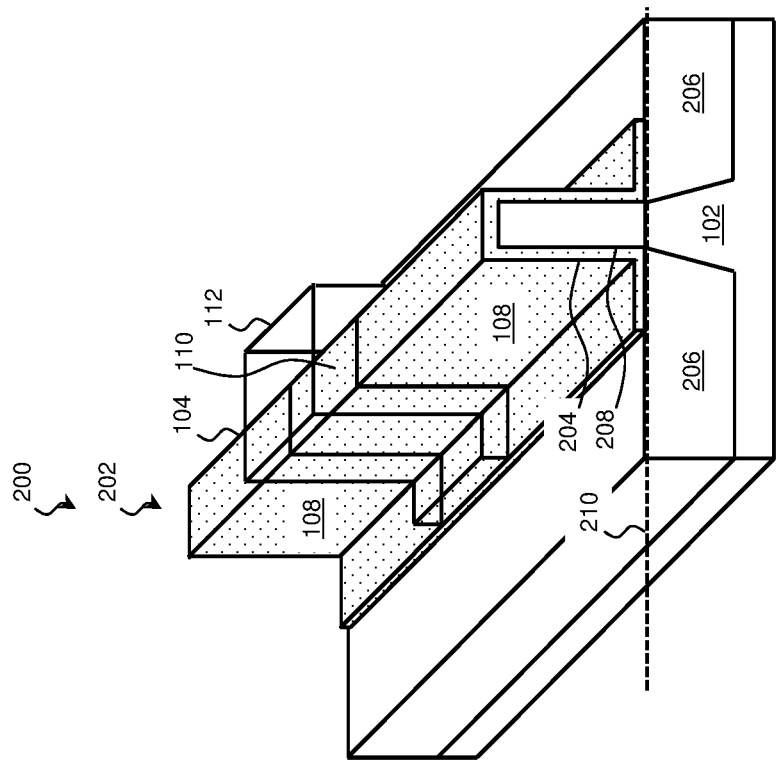
FIG. 2 is a perspective view of a portion of a workpiece containing a thin-sheet FinFET according to various aspects of the present disclosure.

The present disclosure relates generally to IC devices and their fabrication and, more particularly, to a thin-sheet non-planar circuit device such as a FinFET.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90° or at other orientations) and the spatially relative descriptors used herein may likewise be interpreted accordingly.

Figure 1:
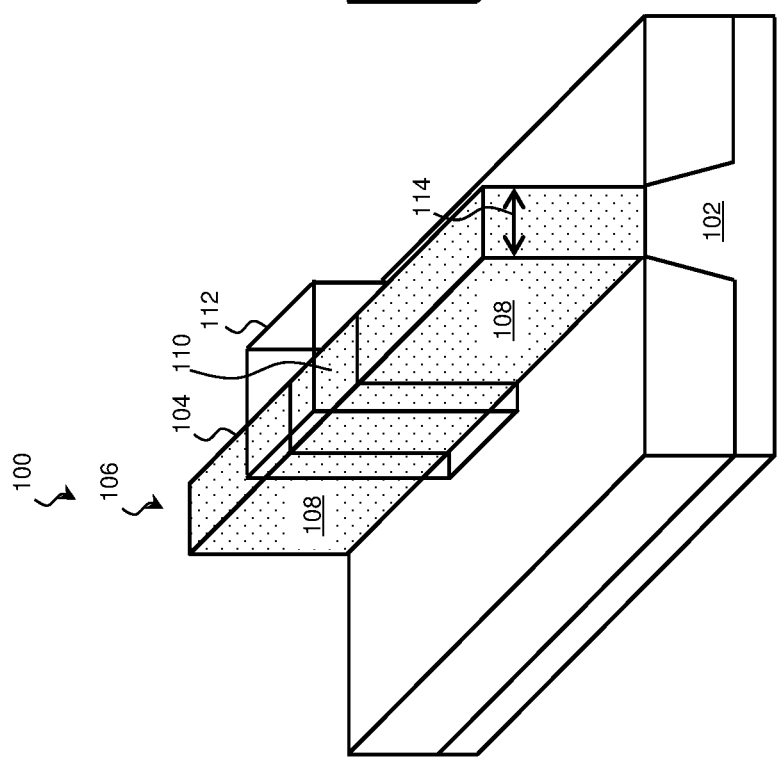
FIG. 1 is a perspective view of a portion of a workpiece according to various aspects of the present disclosure.

FIG. 1 is a perspective view of a portion of a workpiece 100 according to various aspects of the present disclosure. FIG. 1 has been simplified for the sake of clarity and to better illustrate the concepts of the present disclosure. Additional features may be incorporated into the workpiece 100, and some of the features described below may be replaced or eliminated for other embodiments of the workpiece 100.

The workpiece 100 includes a substrate 102 or wafer with one or more fin structures 104 formed upon it. The fin structures 104 are representative of any raised feature, and while the illustrated embodiments include a FinFET 106 formed on the fin structure 104, further embodiments include other raised active and passive devices formed upon the fin 104. The exemplary FinFET 106 is a transistor and comprises a pair of opposing source/drain regions 108, each of which may include various doped semiconductor materials, and a channel region 110 positioned between the source/drain regions. The flow of carriers (electrons for an n-channel device and holes for a p-channel device) through the channel region 110 is controlled by a voltage applied to a gate stack 112 adjacent to and overwrapping the channel region 110. The gate stack 112 is shown as translucent to better illustrate the underlying channel region 110. In the illustrated embodiment, the channel region 110 rises above the plane of the substrate 102 upon which it is formed, and accordingly, the fin structure 104 may be referred to as a "non-planar" device. The raised channel region 110 provides a larger surface area proximate to the gate stack 112 than comparable planar devices. This strengthens the electromagnetic field interactions between the gate stack 112 and the channel region 110, which may reduce leakage and short channel effects associated with smaller devices. Thus in many embodiments, FinFETs 106 and other non-planar devices deliver better performance in a smaller footprint than their planar counterparts.

However, although FinFETs 106 may exhibit improved performance, they are not immune to complications resulting from reduced device size. It has been determined through experimentation that as the size of the fin structure 104 is reduced, the performance is adversely impacted in a number of ways. For example, reductions in body thickness (corresponding to a reduction in fin width indicated by arrow 114), have been shown to decrease the mobility of carriers through the channel region 110. As a consequence, the effective resistance of the channel region 110 increases, resulting in lost power. Furthermore, channel region resistance also becomes more sensitive to manufacturing imperfections. For example, fluctuations in body thickness along the channel region 110, sometimes referred to as line width roughness, may become more pronounced when forming small fins 104. As the overall fin width is reduced, the variations account for a larger portion of the total size. For these reasons and others, the mobility and channel resistance may be vastly different across fin structures 104 of the workpiece.

Another size-dependent effect is quantum-mechanical confinement. Generally, as body thickness is reduced, the threshold voltage, $V_{th}$, of a device such as a FinFET 106 increases. The threshold voltage is the minimum voltage needed at the gate stack 112 to allow substantial current to flow between the source/drain regions 108. Integrated circuits are typically designed for a particular threshold voltage or voltage range. However, as the body thickness is decreased, the threshold voltage increases exponentially. At extremely small sizes, a small change in body thickness across devices can result in a wide discrepancy in respective $V_{th}$. Thus, variations in threshold voltage between devices become more pronounced.

For these reasons and others, alternatives to a semiconductor-based channel region 110 may provide improved carrier mobility, lower body resistance, and more consistent performance. FIG. 2 is a perspective view of a portion of a workpiece 200 containing a thin-sheet FinFET 202 according to various aspects of the present disclosure. FIG. 2 has been simplified for the sake of clarity and to better illustrate the concepts of the present disclosure. Additional features may be incorporated into the workpiece 200, and some of the features described below may be replaced or eliminated for other embodiments of the workpiece 200. The FinFET device 202 of the workpiece 200 is understood to represent any active or passive fin-based device, and the concepts of the present disclosure apply equally to any of these alternatives.

In many respects, the workpiece 200 is similar to workpiece 100 of FIG. 1. However, in contrast to the previous embodiments, the channel region 110 is formed on a thin sheet (i.e., sheet layer 204) that is draped over a raised feature referred to as a rib structure 208 extending up from the substrate 102. In some embodiments, the source/drain regions 108 are also formed on the sheet layer 204. When compared to a conventional semiconductor material, the material used to form the sheet layer 204 may have a higher intrinsic carrier mobility than a conventional semiconductor as described in more detail below. Thus, even though the channel region 110 may have a reduced cross-sectional area (generally related to reduced mobility and higher resistivity), the corresponding FinFET 202 may still exhibit increased mobility with greater consistency across FinFETs 202. Correspondingly, channel resistance and threshold voltages may be more uniform as well.

The structure of the thin-sheet FinFET 202 will now be described in more detail. The FinFET 202 is formed on a substrate 102 or wafer. Suitable substrates 102 include both semiconductor and non-semiconductor substrates. For example, the substrate 102 may include a bulk silicon substrate. Alternatively, the substrate 102 may comprise an elementary semiconductor, such as silicon or germanium in a crystalline structure; a compound semiconductor, such as silicon germanium, silicon carbide, gallium arsenic, gallium phosphide, indium phosphide, indium arsenide, and/or indium antimonide; or combinations thereof. Possible substrates 102 also include a semiconductor-on-insulator (SOI) substrate. SOI substrates are fabricated using separation by implantation of oxygen (SIMOX), wafer bonding, and/or other suitable methods. In various embodiments, generally non-conductive substrates 102 include quartz and/or glass insulators, semiconductor oxides, semiconductor nitride, and/or semiconductor oxynitrides.

To form a variety of planar and non-planar devices, the substrate 102 may include various doped regions depending on design requirements as known in the art (e.g., p-type wells or n-type wells). The doped regions are doped with p-type dopants, such as boron or $BF_2$; n-type dopants, such as phosphorus or arsenic; or combinations thereof. The doped regions may be formed directly on the substrate 102, in a P-well structure, in an N-well structure, in a dual-well structure, or on or within a raised structure. The semiconductor substrate 102 may further include various active regions, such as regions configured for an N-type metal-oxide-semiconductor transistor device (nMOS) and regions configured for a P-type metal-oxide-semiconductor transistor device (pMOS).

The substrate 102 may include one or more isolation features 206 formed on it to electrically isolate circuit devices including the illustrated thin-sheet FinFET 202. In the illustrated embodiment, the isolation feature 206 includes a shallow trench isolation (STI) feature. In other embodiments, the isolation feature 206 is a component (e.g., layer) of a silicon-on-insulator substrate 102. In yet another exemplary embodiment, an isolation feature 206 takes the form of a buried oxide layer (BOX). The isolation feature 206 comprises any suitable material, including a semiconductor oxide, a semiconductor nitride, a semiconductor oxynitride, a semiconductor carbide, fluoride-doped silicate glass (FSG), low-K dielectric material, and/or other suitable materials, and may be formed using any suitable deposition process including thermal growth, atomic layer deposition (ALD), chemical vapor deposition (CVD), high-density plasma CVD (HDP-CVD), physical vapor deposition (PVD), and/or other suitable deposition processes.

The FinFET 106 includes a rib structure 208 extending above the top surface 210 of the substrate 102 and includes a sheet layer 204 formed on the rib structure 208. In some embodiments, the rib structure 208 is a portion of the substrate 102 that extends through the isolation feature 206, although the rib structure 208 may also be a separate semiconductor, dielectric, and/or other support material. In various embodiments, the rib structure 208 includes a semiconductor material (e.g., an elementary semiconductor and/or a compound semiconductor), a dielectric material (e.g., a semiconductor oxide, a semiconductor nitride, a semiconductor oxynitride, a semiconductor carbide, FSG, and/or a low-K dielectric material), an insulator material (e.g., quartz, glass, etc.), and/or combinations thereof.

In some embodiments, such as those of FIGS. 44-50, described below, the rib structure 208 includes a conductor such as polysilicon and/or a metal such as aluminum, copper, titanium, tantalum, tungsten, molybdenum, tantalum nitride, nickel silicide, cobalt silicide, TiN, WN, TiAl, TiAlN, TaCN, TaC, TaSiN, metal alloys, other suitable materials, and/or combinations thereof. In such embodiments, the conductor of the rib structure 208 may be part of a second gate stack. The second gate stack may include a gate dielectric disposed over the conductor that physically and electrically isolates the conductive material from the sheet layer 204.

The sheet layer 204 is disposed over the rib structure 208, and in some embodiments, on a portion of the top surface 210 of the substrate 102 and/or isolation feature 206. The sheet layer 204 includes a channel region 110 disposed under the gate stack 112 and may also include source/drain regions 108. In various embodiments, the sheet layer 204 is formed to include one or more layers of a 2D material. Suitable 2D materials include graphene and other materials that align along a single plane or sheet at the molecular level.

Figure 3:
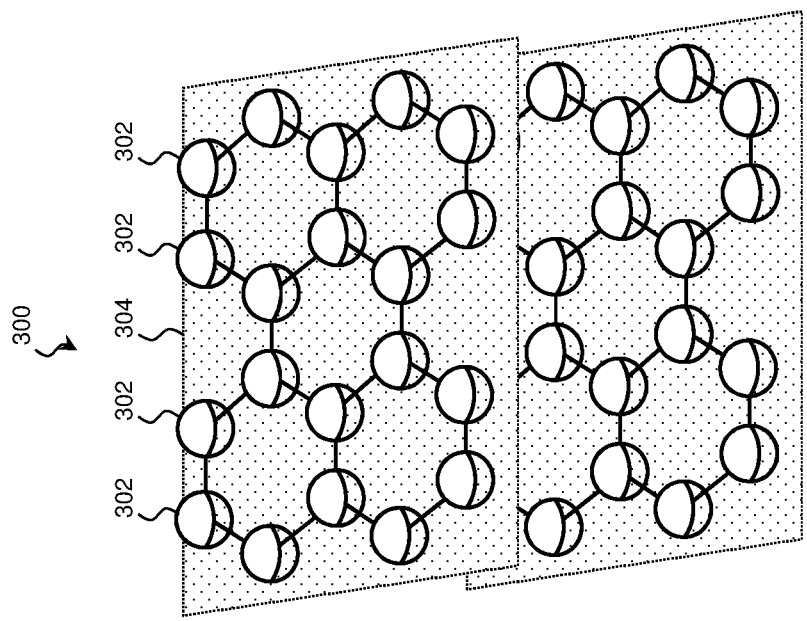
FIG. 3 is a molecular diagram of graphene according to various aspects of the present disclosure.

Referring to FIG. 3, a molecular diagram 300 of graphene is shown according to aspects of the present disclosure. Graphene is an arrangement of carbon atoms 302 in monolayers aligned along a single plane 304. Techniques for forming monolayers of graphene in a sheet layer 204 are described in further detail in the context of FIG. 14. As pure graphene has a high conductivity, it may be doped with one or more impurities within the channel region 110 to control mobility and induce a semiconductor-like response to a gate voltage. Thus, in various embodiments, the graphene is doped with titanium, chromium, iron, $NH_3$, potassium, and/or $NO_2$.

Figure 4:
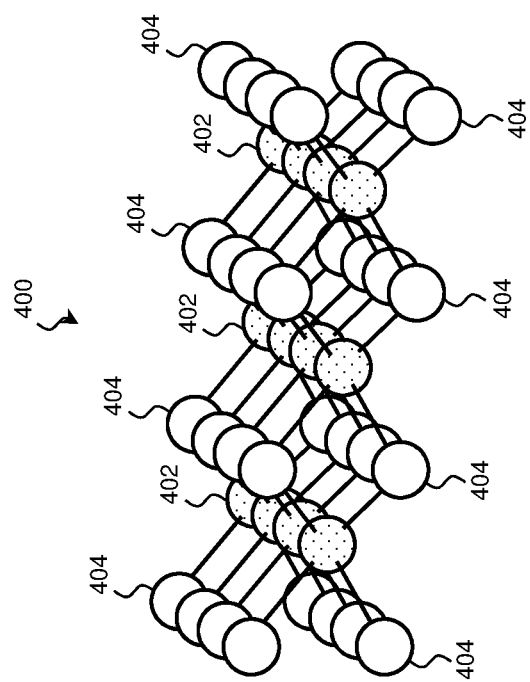
FIG. 4 is a molecular diagram of a transition metal dichalcogenide compound according to various aspects of the present disclosure.

Another class of suitable 2D materials for the sheet layer 204 is disclosed in the context of FIG. 4. FIG. 4 is a molecular diagram 400 of a transition metal dichalcogenide compound according to aspects of the present disclosure. The compound includes atoms 402 of a transition metal (e.g., Zr, Ta, Nb, W, Mo, Ga, Sn, etc.) represented by filled circles and atoms 404 of a chalcogenide (e.g., Se, S, Te, etc.) represented by open circles. Similar to graphene, transition metal dichalcogenide materials align in generally planar monolayers. Also similar to graphene, transition metal dichalcogenide materials exhibit high conductivity and carrier mobility, making them well-suited for use in the sheet layer 204 of the thin-sheet FinFET 202.

Referring back to the thin-sheet FinFET 202 of FIG. 2, a gate stack 112 is disposed over the sheet layer 204 and defines the channel region 110 of the sheet layer 204. In various exemplary embodiments, the gate stack 112 includes an interfacial layer, a conductor such as polysilicon and/or a metal conductor, and a gate dielectric formed between the conductor and the sheet layer 204.

Figure 5:
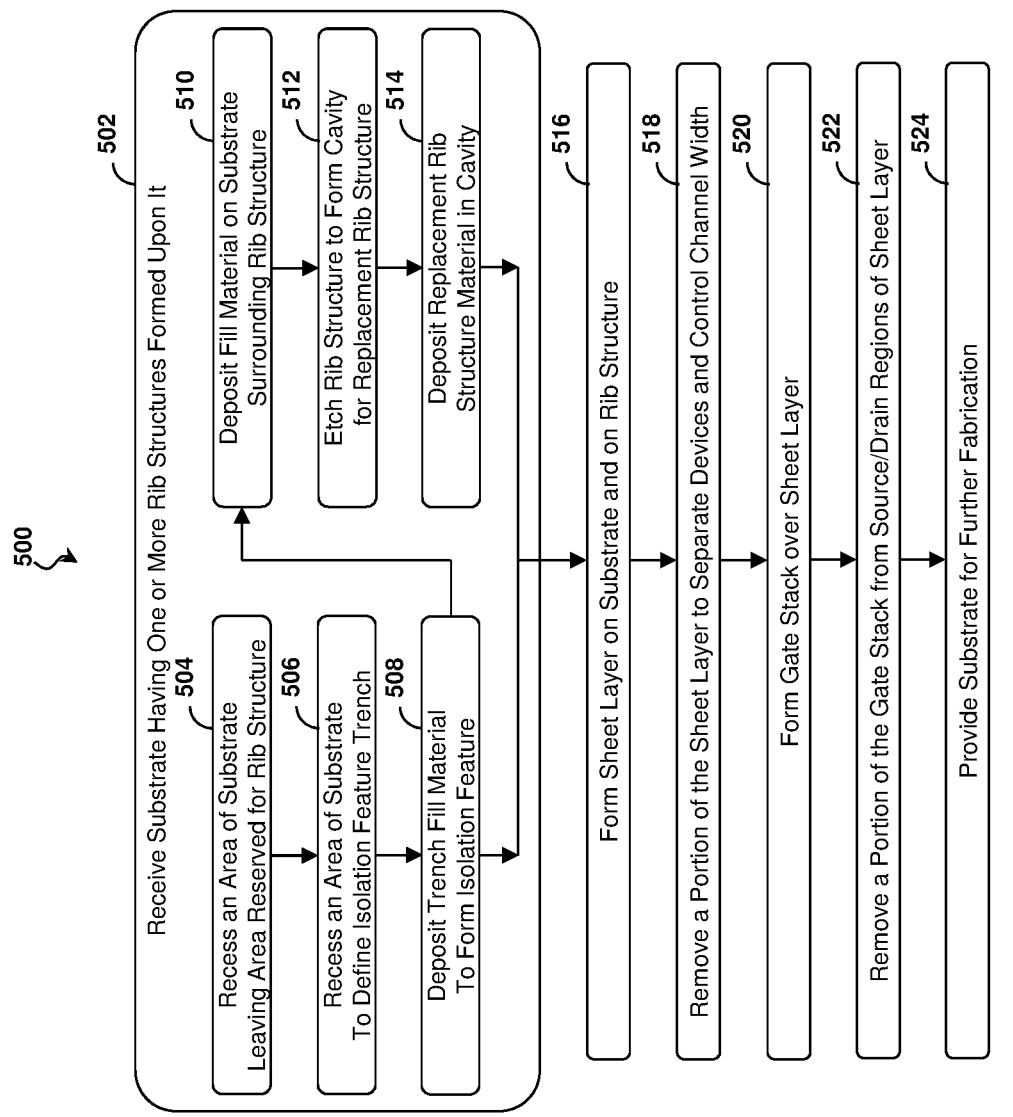
FIG. 5 is a flow diagram of an exemplary method for forming a trigate FinFET device according to various aspects of the present disclosure.
Figure 16:
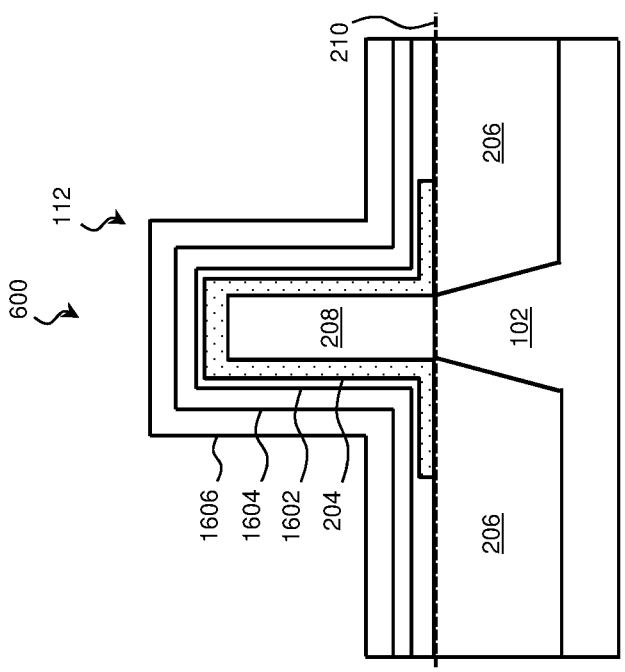
FIG. 16 is a cross-sectional view of a portion of a workpiece undergoing a method of forming a trigate FinFET device according to various aspects of the present disclosure.

Various exemplary embodiments of the thin-sheet FinFET device 202 and techniques for forming the embodiments will now be described. It is understood that elements of the illustrated devices may be combined, interchanged, added, or removed between the various examples, and no particular feature or advantage is required for any particular embodiment. An exemplary trigate thin-sheet FinFET device is disclosed with reference to FIGS. 5-17. FIG. 5 is a flow diagram of an exemplary method 500 for forming the trigate FinFET device according to various aspects of the present disclosure. It is understood that additional steps can be provided before, during, and after the steps of method 500, and that some of the steps described can be replaced or eliminated for other embodiments of the method. FIGS. 6-15 and 17 are perspective views of a portion of a workpiece 600 undergoing the method 400 of forming a trigate FinFET device 202 according to various aspects of the present disclosure. FIG. 16 is a cross-sectional view of a portion of a workpiece 600 undergoing a method of forming a trigate FinFET device 202 according to various aspects of the present disclosure. FIGS. 6-17 have been simplified for the sake of clarity and to better illustrate the concepts of the present disclosure. Additional features may be incorporated into the workpiece 600, and some of the features described below may be replaced or eliminated for other embodiments of the workpiece 600.

Referring to block 502 of FIG. 5, a substrate 102 is received. The substrate 102 may be substantially similar to the substrate 102 of FIG. 2 and may include an elementary semiconductor, a compound semiconductor, an insulator, and/or other suitable substrate 102 materials. The received substrate 102 has one or more rib structures 208 formed upon it. Two exemplary techniques for forming rib structures 208 are described with respect to FIGS. 6-10 and FIGS. 6-13, respectively. Additional exemplary techniques for forming a rib structure 208 are described with respect to FIGS. 51-69.

Figure 7:
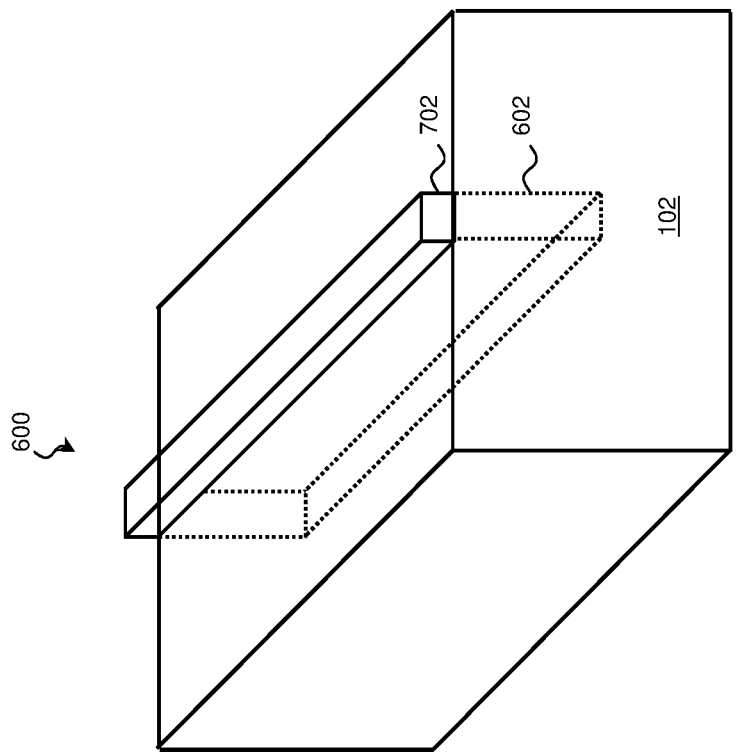
Figure 6:
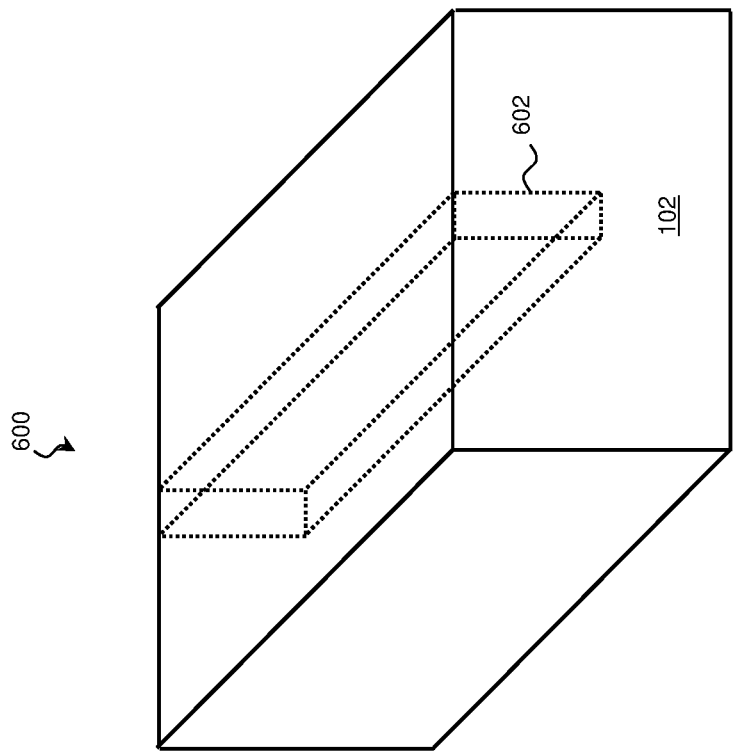

In a first exemplary technique described in blocks 504-508 of FIG. 5 and FIGS. 6-10, the rib structure 208 is formed by etching the surrounding substrate 102 to reveal the rib structure 208. Referring to FIG. 6, a substrate 102 is illustrated and a region of the substrate that is used to form a rib structure 208 is indicated by the dashed box 602. Referring to block 504 of FIG. 5, areas of the substrate 102 surrounding the rib structure region are recessed. In some embodiments, this includes forming a photoresist layer 702 over the substrate 102 and patterning it to expose the portions of the substrate 102 that are to be recessed by the etchant. In the embodiment of FIG. 7, the photoresist layer 702 has been patterned to leave the photoresist material over the rib structure region. An exemplary photoresist layer 702 includes a photosensitive material that causes the layer 702 to undergo a property change when exposed to light. This property change can be used to selectively remove exposed or unexposed portions of the photoresist layer 702 in a process referred to as lithographic patterning. An exemplary patterning process includes soft baking of the photoresist layer 702, mask aligning, exposure, post-exposure baking, developing the photoresist layer 702, rinsing, and drying (e.g., hard baking). Alternatively, a photolithographic process may be implemented, supplemented, or replaced by other methods such as maskless photolithography, electron-beam writing, and ion-beam writing.

Referring still to block 504 of FIG. 5 and referring to FIG. 8, an etching process is performed on the substrate 102. The etching may include any suitable etching process including dry etching, wet etching, and/or other etching methods (e.g., reactive ion etching (RIE)). For example, in an embodiment, the substrate 102 is etched in a dry etching process using a fluorine-based etchant. In some embodiments, etching includes multiple etching steps with different etching chemistries, each targeting a particular material of the substrate 102. The etching is configured to produce rib structures 208 of any suitable height and width extending above the remainder of the substrate 102.

Referring to block 506 of FIG. 5 and to FIG. 9, the substrate 102 may be selectively etched to define one or more isolation feature trenches 902. The etching of block 506 may be performed substantially similar to the etching of block 504, and in an embodiment, both etchings are performed as part of a single etching process. Should the etching technique or chemistries vary, the etching of block 506 may use any suitable etching technique include dry etching, wet etching, RIE, and/or other etching methods. In some embodiments, the photoresist layer 702 formed in block 504 may be reused in the etching of block 506 or the existing photoresist layer may be stripped and a new photoresist layer may be deposited over the substrate 102 and patterned.

Figure 10:
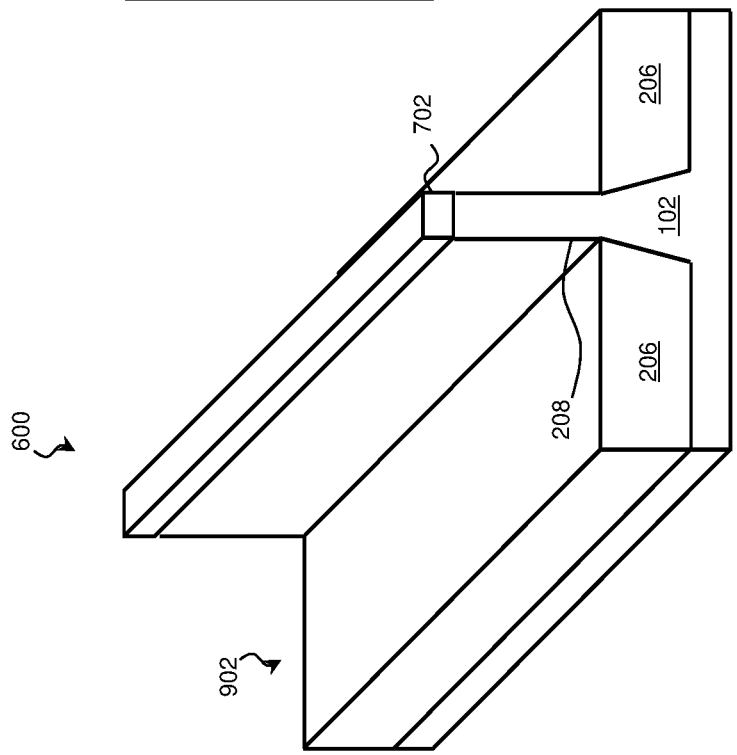

Referring to block 508 of FIG. 5 and to FIG. 10, an isolation feature 206 is formed by depositing a fill material in the trench 902. In some embodiments, the formation of the isolation feature includes depositing a liner (not shown) in the trench 902. The liner reduces crystalline defects at the interface between the substrate 102 and the fill material. The liner may include any suitable material including a semiconductor nitride, a semiconductor oxide, a thermal semiconductor oxide, a semiconductor oxynitride, a polymer dielectric, and/or other suitable materials, and may be formed using any suitable deposition process including thermal growth, ALD, CVD, HDP-CVD, PVD, and/or other suitable deposition processes. In some embodiments, the liner includes a conventional thermal oxide liner formed by a thermal oxidation process. In some exemplary embodiments, the liner includes a semiconductor nitride formed via HDP-CVD.

The fill material or fill dielectric is then formed within the trench 902. Exemplary fill dielectric materials include a semiconductor oxide, a semiconductor nitride, a semiconductor oxynitride, FSG, and/or a low-K dielectric material. In various exemplary embodiments, an oxide fill dielectric material is formed using a HDP-CVD process, a sub-atmospheric CVD (SACVD) process, a high-aspect ratio process (HARP), and/or a spin-on process.

It is understood that the technique of blocks 504-508 is only one example of the many suitable techniques for forming a rib structure 208 on a substrate 102. In that regard, the rib structure 208 formed in blocks 504-508 may be used to form an active device such as the FinFET described below. Additionally or in the alternative, a portion of the rib structure 208 may be replaced by a different material before being used to form an active device. An exemplary rib structure replacement technique is described in blocks 510-514.

Figure 11:
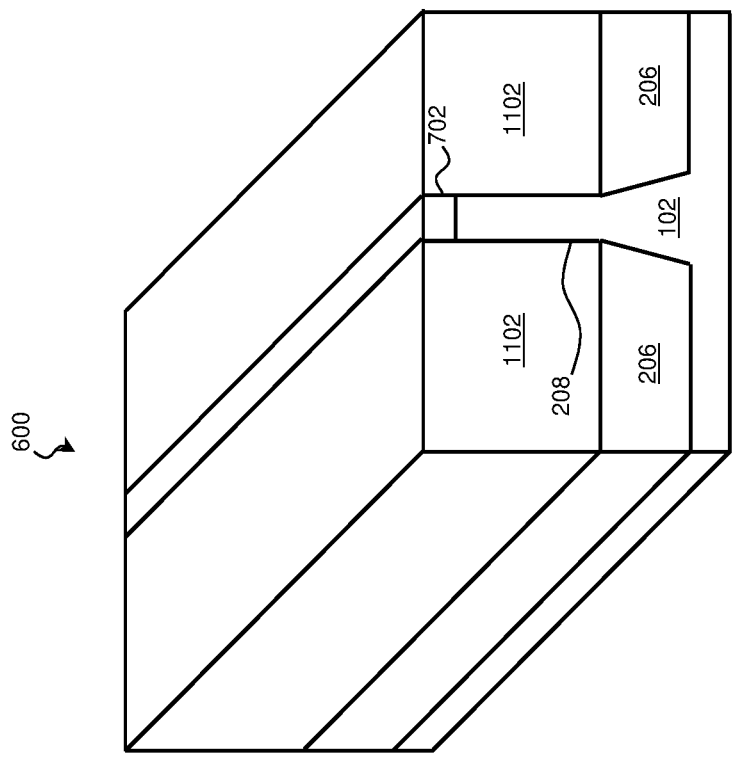

Referring to block 510 of FIG. 5 and to FIG. 11, a dielectric fill material 1102 is formed on the substrate 102 and surrounding the existing rib structure 208. A chemical mechanical polish/planarization (CMP) process may be performed on the dielectric fill material 1102 following its deposition.

Figure 12:
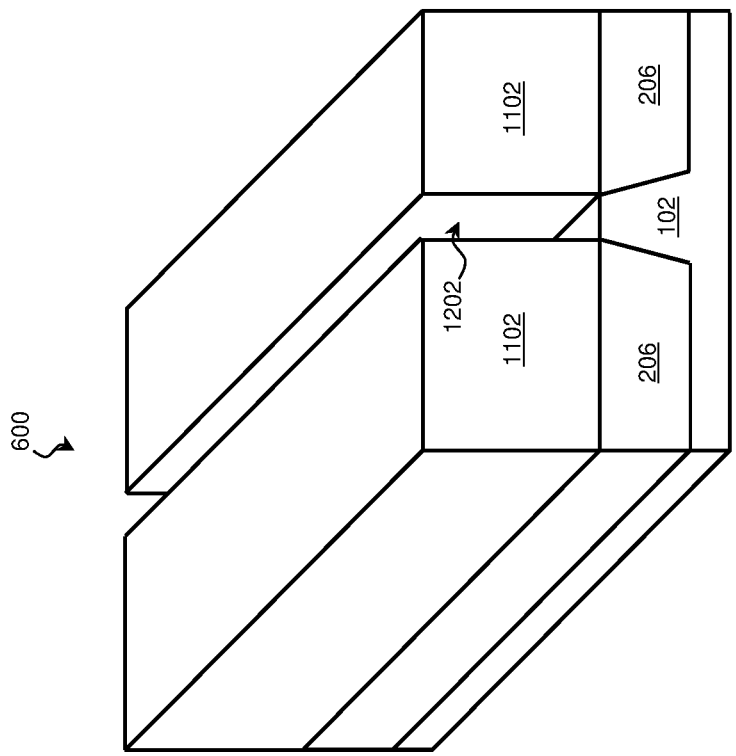
Figure 15:
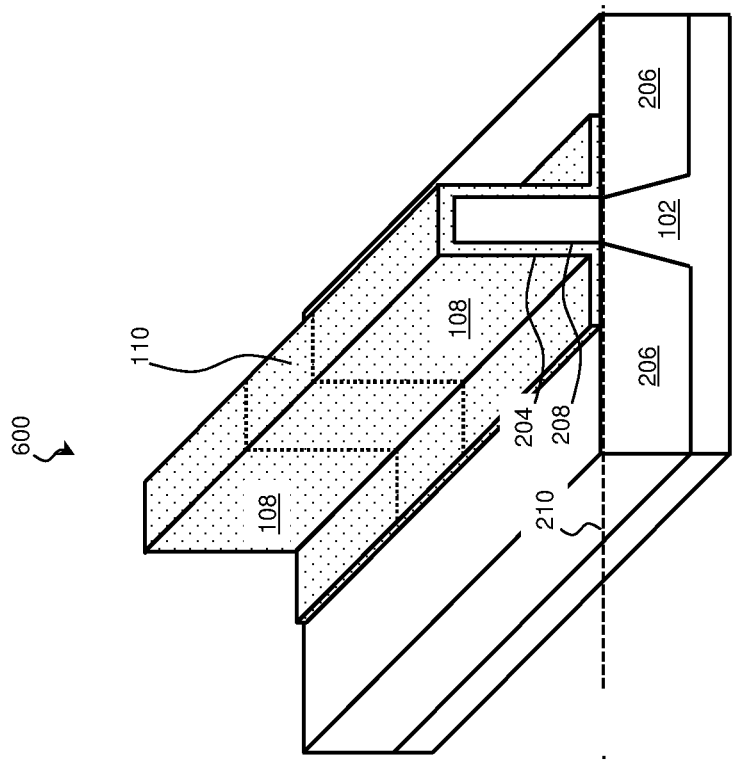

Referring to block 512 of FIG. 5 and to FIG. 12, the rib structure 208 and any remaining resist 702 are etched to define a cavity 1202 for the replacement rib structure. The etching may include any suitable etching process including dry etching, wet etching, and/or other etching methods such as RIE. The etching process is configured to remove some or all of the rib structure 208, and in the illustrated embodiment, the rib structure 208 is etched until its top surface is coplanar with a top surface of the isolation features 206. In some embodiments, a portion of the rib structure 208 remains after etching to act as a seed layer for the formation of the replacement rib structure.

Figure 13:
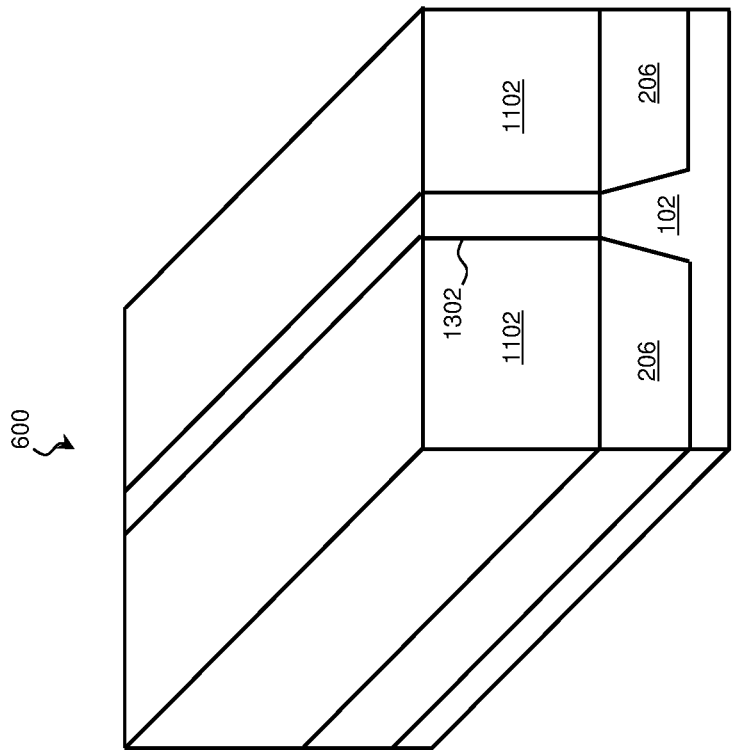

Referring to block 514 of FIG. 5 and to FIG. 13, a replacement rib structure 1302 is formed in the cavity 1202 left by the removal of the original rib structure 208. The technique used to form the replacement rib structure 1302 may depend on the materials of the replacement rib structure 1302 and in that regard, suitable materials include conductors, semiconductors, and dielectrics such as semiconductor oxides, semiconductor nitrides, semiconductor oxynitride, FSG, and/or a low-K dielectric materials. In some embodiments, a conductor-containing replacement rib structure 1302 is formed by PVD (e.g., sputtering, evaporating, electroplating, etc.), CVD, and/or other deposition processes. In some embodiments, a semiconductor-containing replacement rib structure 1302 is formed by an epitaxial growth process. In some embodiments, a dielectric-containing rib structure 1302 is formed using a HDP-CVD process, a sub-atmospheric CVD (SACVD) process, a high-aspect ratio process (HARP), and/or a spin-on process. Forming the replacement rib structure 1302 may also include performing a chemical mechanical polish/planarization (CMP) process following the deposition of the replacement rib structure material. In an embodiment, forming the replacement rib structure 1302 also includes a thermal annealing process following the deposition of the rib structure material. The dielectric fill material 1102 is removed after the replacement rib structure 1302 is formed.

As described above, the embodiments of FIGS. 6-10 and 6-13 are merely some examples of techniques used to form a rib structure on a substrate. Other exemplary techniques for forming a rib structure 208 by etching are disclosed below in the context of FIGS. 51-57.

To avoid unnecessary duplication, the substrate 102 and rib structure 208 of blocks 504-508 and FIG. 10 is used to illustrate the remainder of the method 500 although it is understood that any suitable alternative including the substrate 102 and replacement rib structure 1302 of blocks 504-514 and FIG. 13 may be used as well. Referring to block 516 of FIG. 5 and to FIG. 14, a sheet layer 204 is deposited on the substrate 102 including on the rib structure 208. Along the length of the rib structure 208, the sheet layer 204 has defined upon it: source/drain regions 108 and a channel region 110 disposed between the source/drain regions 108. In many embodiments, the sheet layer 204 has sufficient carrier mobility that the channel region 110 functions even when formed having a relatively small cross-sectional area. In that regard, the sheet layer 204 may be a little as a single molecule in thickness. For example, in some embodiments, the sheet layer 204 includes one or more monolayers of graphene, a sheet based carbon structure, where each sheet is a single atom in thickness. Even in this configuration, graphene has a remarkably high mobility. It is so high that in some embodiments, impurities may be added in order to reduce mobility as described below.

A graphene-containing sheet layer 204 may be formed by epitaxial graphene growth. In one such embodiment, a silicon carbide dielectric is used as a seed layer to promote the epitaxial growth of the graphene on the rib structure 208. Another exemplary technique for forming a graphene-containing sheet layer 204 utilizes CVD (chemical vapor deposition) directly on the rib structure 208 or on a metallic film. The metallic film may be part of the rib structure 208 or may be part of a separate baking material. Graphene formed on the backing material can be adhered to the rib structure 208, allowing the backing to be removed while leaving the graphene of the sheet layer 204. In some embodiments, graphene is formed by reacting a metal film with silicon carbide to form a metal carbide. The metal carbide is annealed to produce a metal silicide and graphene from the remaining carbon. In yet another exemplary embodiment, graphene is deposited using an aqueous solution of graphene oxide.

To control mobility and to produce a semiconductor-like response to a gate voltage, the channel region 110 of the sheet layer may be doped by adding impurities. In some embodiments dopants such as boron (B) and nitrogen (N) are substituted for carbon atoms in the graphene matrix (atomic substitution). Additionally or in the alternative, the regular structure of the graphene may be disrupted by adding dopants such as titanium, chromium, iron, $NH_3$, potassium, and $NO_2$ in order to produce a desired bandgap.

In addition to or as a substitute for graphene, in some embodiments, the sheet layer 204 includes one or more monolayers of a transition metal dichalcogenide. As described above, transition metal dichalcogenides include a transition metal (e.g., Zr, Ta, Nb, W, Mo, Ga, Sn, etc.) and a chalcogenide (e.g., Se, S, Te, etc.). Similar to graphene, transition metal dichalcogenide materials align in generally planar monolayers. In an exemplary embodiment, the sheet layer 204 is formed by depositing $MoS_2$ on the substrate 102 and rib structure 208 by CVD or other suitable deposition process. In further exemplary embodiments, the sheet layer includes $ZrSe_2$, $TaSe_2$, $TaS_2$, $NbSe_2$, $WSe_2$, $MoTe_2$, $MoSe_2$, GaSe, GaS, $SnSe_2$, $SnS_2$ and/or other transition metal dichalcogenides. In various embodiment, transition metal dichalcogenide material of the sheet layer 204 is deposited using molecular beam epitaxy (MBE), CVD, and/or other suitable depositions processes.

Figure 14:
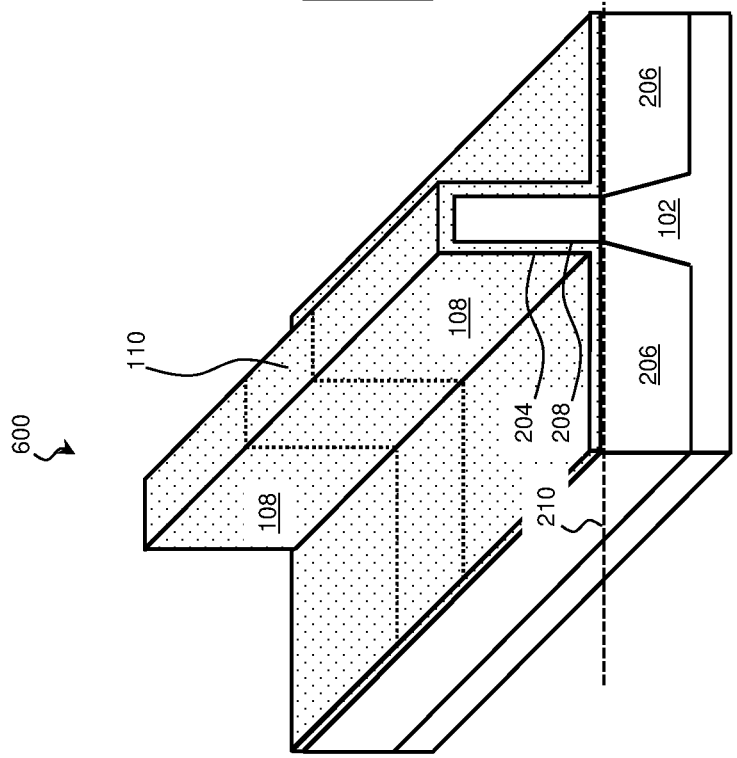

In the illustrated embodiments of FIG. 14, the sheet layer 204 is formed on each exposed side of the rib structure 208. In other words, it is formed on both side surfaces as well as the top surface of the rib structure 208. In addition to being formed on the rib structure 208, the sheet layer 204 may also be formed on the substrate 102 and/or isolation features 206. In particular, the sheet layer may be formed on and physically contacting a top surface 210 which may be part of the substrate 102, part of an isolation feature 206, part of a dielectric layer 1102, or part of another material layer. The sheet layer 204 may be etched back to electrically separate FinFET devices as illustrated in block 518 and FIG. 15. By controlling the amount of the sheet layer 204 left on the top surface 210, the channel width of the FinFET devices can be individually controlled, and thus a single workpiece 600 may have multiple FinFET devices of varying channel widths. The etching of the sheet layer 204 may include depositing a photoresist material on the substrate 102, exposing and patterning the photoresist to expose the portion of the sheet layer 204 to be etched, and etching the portion of the sheet layer 204 formed on the top surface. The etching may include any suitable etching technique, and in various embodiments, includes dry etching, wet etching, reactive ion etching, and/or other etching methods (e.g., reactive ion etching). While the illustrated embodiment shows the portion of the sheet layer 204 being etched before a gate stack is formed, in some embodiments, the etching is performed during or after formation of the gate stack 112 as described in blocks 520-522.

Referring now to block 520 of FIG. 5 and to FIG. 16, a gate stack 112 is deposited over the sheet layer 204. The gate stack 112 may have a multi-layer composition. For example, in the illustrated embodiment, the gate stack 112 includes an interfacial layer 1602 configured to bond with the sheet layer, a gate dielectric layer 1604 configured to electrically insulate the conductive portions of the gate stack 112 from the sheet layer 204, and a gate electrode layer 1606. It is understood that no layer is required or characteristic of any particular gate stack 112. For example, in some embodiments, the interfacial layer 1602 is omitted.

In more detail, the interfacial layer 1602 may include any suitable material configured to bond to the sheet layer 204 without disrupting the sheet layer 204. In that regard, suitable materials include semiconductor oxides, semiconductor nitrides, semiconductor oxynitrides, other suitable interfacial materials, and/or combinations thereof. In various embodiments, the interfacial layer 1602 is formed on and directly contacting the sheet layer 204 to any suitable thickness using any suitable process including thermal growth, ALD, CVD, HDP-CVD, PVD, spin-on deposition, and/or other suitable deposition processes. The interfacial layer 1602 may also be formed on the top surface 210 of the substrate 102, the isolation feature 206, and/or the dielectric layer 1102 as shown.

One or more gate dielectric layers 1604 may be formed on the interfacial layer 1602 or on the sheet layer 204 directly. The gate dielectric layers 1604 include dielectric materials, which are commonly characterized by their dielectric constant (k) relative to silicon dioxide. Thus, each gate dielectric layer 1604 may include a high-k dielectric material such as $HfO_2$, HfSiO, HfSiON, HfTaO, HfTiO, HfZrO, zirconium oxide, aluminum oxide, hafnium dioxide-alumina ($HfO_2$—$Al_2O_3$) alloy, other suitable high-k dielectric materials, and/or combinations thereof. Additionally or in the alternative, a gate dielectric layer 1604 may include other dielectrics such as a semiconductor oxide, semiconductor nitride, semiconductor oxynitride, semiconductor carbide, amorphous carbon, tetraethylorthosilicate (TEOS), other suitable dielectric material, and/or combinations thereof. The gate dielectric layers 1604 may be formed to any suitable thickness using any suitable process including ALD, CVD, HDP-CVD, PVD, spin-on deposition, and/or other suitable deposition processes.

A gate electrode layer 1606 is formed on the gate dielectric layer 1604. Despite naming conventions such as MOSFET (metal-oxide-semiconductor FET), workpiece 600 includes embodiments with polysilicon-containing gate electrode layers 1606 as well as metal-containing electrode layers. Accordingly, the gate electrode layer 1604 may include any suitable material, including polysilicon, aluminum, copper, titanium, tantalum, tungsten, molybdenum, tantalum nitride, nickel silicide, cobalt silicide, TiN, WN, TiAl, TiAlN, TaCN, TaC, TaSiN, metal alloys, other suitable materials, and/or combinations thereof. Work function metal gate materials included in a metal-containing gate electrode layer 1606 may be n-type or p-type work function materials. Exemplary p-type work function metals include TiN, TaN, Ru, Mo, Al, WN, $ZrSi_2$, $MoSi_2$, $TaSi_2$, $NiSi_2$, WN, other suitable p-type work function materials, and/or combinations thereof. Exemplary n-type work function metals include Ti, Ag, TaAl, TaAlC, TiAlN, TaC, TaCN, TaSiN, Mn, Zr, other suitable n-type work function materials, and/or combinations thereof. In various embodiments, the conductor of the gate electrode layer 1606 is deposited by CVD, PVD, and/or other suitable process.

Along the length of the rib structure 208, the gate stack 112 may be formed on and wrapped around the channel region 110 of the sheet layer 204. The gate stack may also extend past the channel region 110 and be formed on one or more source/drain regions 108. In such embodiments, the gate stack 112 may be etched back from the source/drain regions 108 as shown in block 522 of FIG. 5 and FIG. 17. In one such embodiment, this includes: forming a photoresist material over the gate stack 112; exposing and patterning the photoresist material to expose a portion of the gate stack 112 to be etched; and etching the exposed gate stack 112 to remove the exposed portion. Suitable etching processes include wet etching, dry etching, reactive ion etching, and other suitable etching techniques. In some embodiments, the etching of the gate stack 112 is performed as part of the etching of the sheet layer 204 described in block 518.

Figure 17:
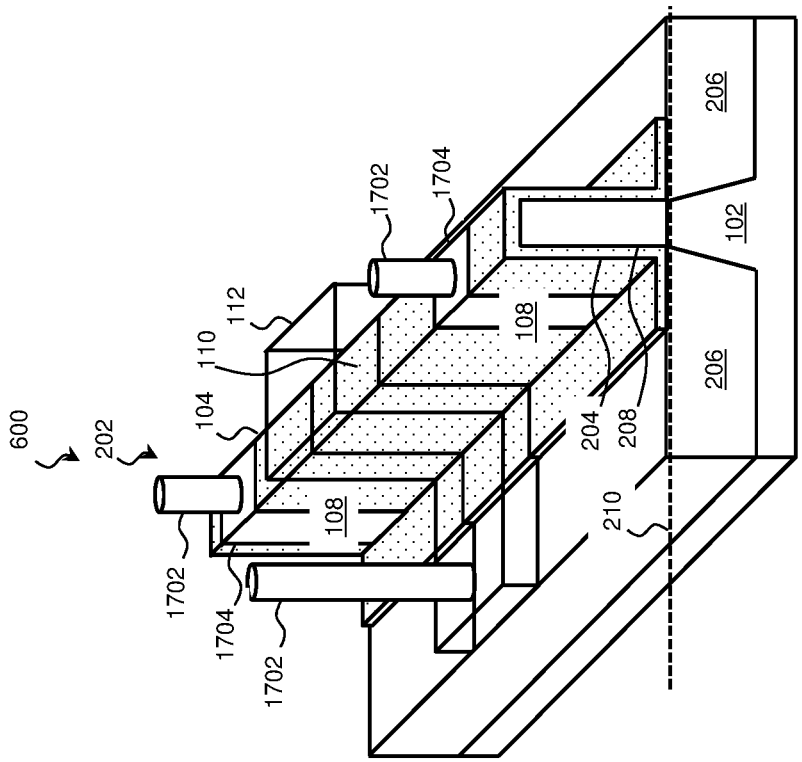
FIG. 17 is a perspective view of a portion of a workpiece undergoing a method of forming a trigate FinFET device according to various aspects of the present disclosure.

Referring to block 524 of FIG. 5 and referring still to FIG. 17, the workpiece 600 containing the trigate FinFET 202 is provided for further fabrication and packaging processes. This may include the formation of contacts 1702 that electrically couple the gate stack 112 and the source/drain regions 108 to other active and passive devices of the workpiece 600 via an interconnect structure. The contacts 1702 may be formed from any suitable conductor with common examples including copper and tungsten. In some embodiments, a contact 1702 includes a collet 1704 formed from the conductor of the contact 1702 in order to increase the contact area with the gate stack 112 or source/drain region 108. By increasing the surface area, the collet 1704 improves reliability and reduces contact resistance. When used to couple to a feature disposed on the fin structure 104 such as a source/drain region 108, a collet 1704 may extend over more than one surface. In the illustrated embodiment, the collets 1704 contact the top surface and each side surface of the sheet layer 204 formed on the fin structure 104.

Figure 18:
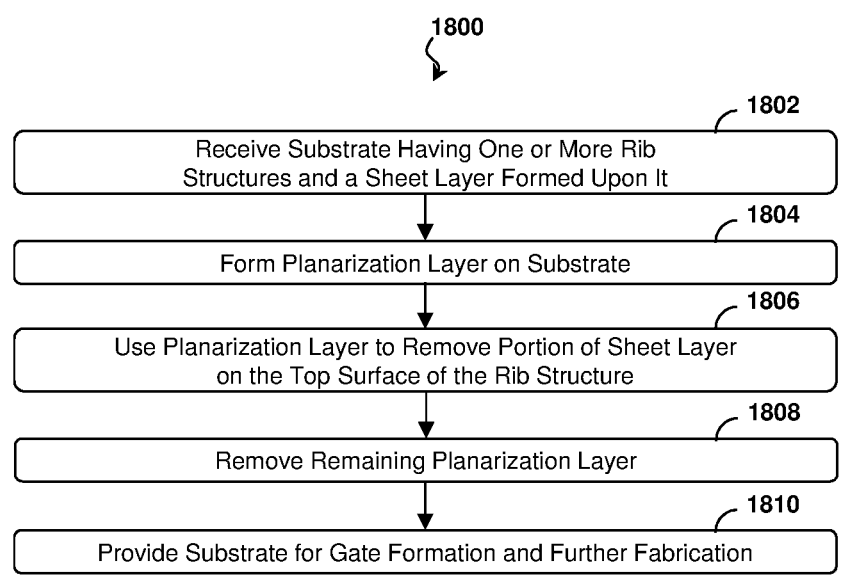
FIG. 18 is a flow diagram of an exemplary method for forming a double-gate FinFET device according to various aspects of the present disclosure.
Figure 20:
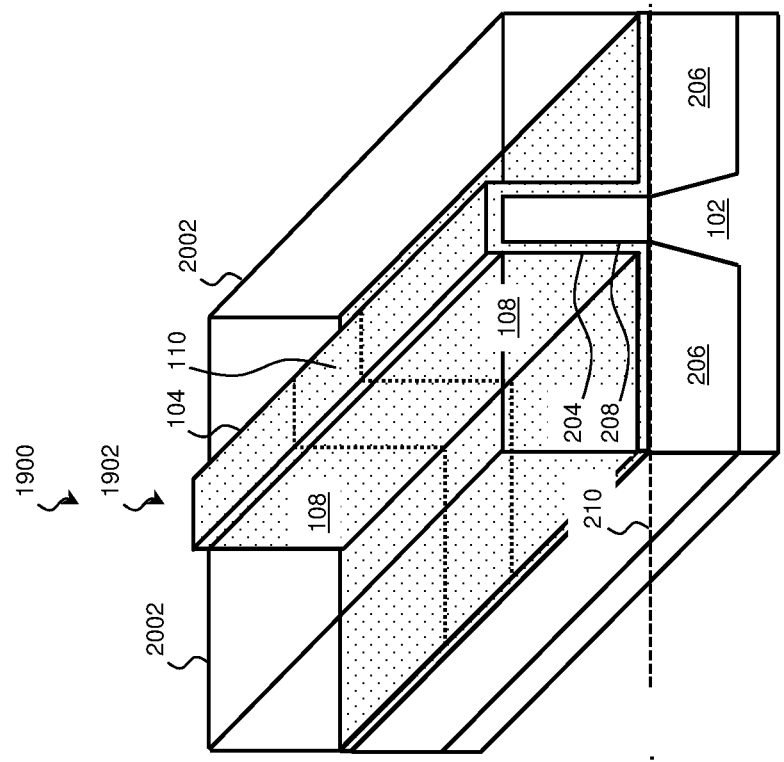

Other exemplary embodiments of the thin-sheet FinFET device and techniques for forming the embodiments will now be described. Turning to FIGS. 18-24, a double-gate thin-sheet FinFET device 1902 is disclosed. As will be shown, the double-gate thin-sheet FinFET 1902 may be used as two independent transistor devices with a common gate or as a single transistor device. FIG. 18 is a flow diagram of an exemplary method 1800 for forming a double-gate FinFET device according to various aspects of the present disclosure. It is understood that additional steps can be provided before, during, and after the steps of method 1800, and that some of the steps described can be replaced or eliminated for other embodiments of the method. FIGS. 19-24 are perspective views of a portion of a workpiece 1900 undergoing a method of forming a double-gate FinFET device 1902 according to various aspects of the present disclosure. FIGS. 19-24 have been simplified for the sake of clarity and to better illustrate the concepts of the present disclosure. Additional features may be incorporated into the workpiece 1900, and some of the features described below may be replaced or eliminated for other embodiments of the workpiece 1900.

Figure 19:
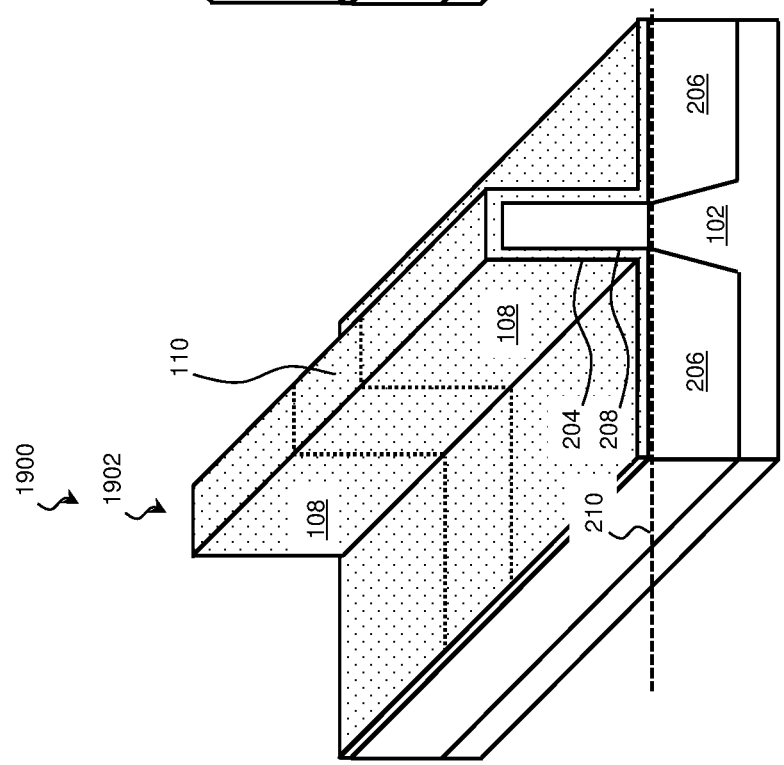

Referring to block 1802 of FIG. 18 and to FIG. 19, a workpiece 1900 is received. The workpiece 1900 may be substantially similar to that of FIG. 14, and in that regard, may include a substrate 102 having a rib structure 208 formed upon it and a sheet layer 204 formed on the rib structure 208. The forming of the rib structure 208 and the sheet layer 204 may be performed substantially as described in blocks 502-516 of FIG. 5 or by any other suitable technique. Referring to block 1804 of FIG. 18 and to FIG. 20, a planarization layer 2002 is formed on the substrate 102. The planarization layer 2002 is used to control a subsequent etching or polishing process and may be selected for its mechanical and/or chemical stability. For example, in an embodiment, the planarization layer 2002 includes a low-temperature oxide deposited by CVD. Other suitable processes for forming the planarization layer 2002 include HDP-CVD, PVD, and/or other suitable deposition processes. As the planarization layer 2002 is used to control a subsequent etching or polishing process, it may be formed to a thickness (measured perpendicular to the top surface 210 of the substrate 102 and/or isolation feature 206) configured to expose the top surface of the fin structure 104 as shown in the illustrated embodiment. In alternate embodiments, the planarization layer 2002 is first formed to cover the sheet layer 204 and is thinned to expose the top surface of the fin structure 104 as part of the removal process of block 1806.

Referring to block 1806 of FIG. 18 and to FIG. 21, the sheet layer 204 on the top surface of the rib structure 208 is removed. In an exemplary embodiment, a CMP process removes the portion of the sheet layer 204 that is exposed by the planarization layer 2002. In further exemplary embodiments, a chemical etching process such as a wet etching, dry etching, RIE, and/or other etching process is used to remove the portion of the sheet layer 204 exposed by the planarization layer 2002. The etching of block 1806 may completely remove the portion of the sheet layer 204 on the top surface of the rib structure 208 so that the portions of the sheet layer 204 on the side surfaces of the rib structure 208 (e.g., portions 2102 and 2104) are electrically uncoupled. Accordingly, a pair of source/drain regions 108 and an interposed channel region 110 are formed on one side surface of the rib structure 208 and are visible in FIG. 21. On the opposing side surface, obscured by the perspective of FIG. 21, a symmetrical arrangement of source/drain regions and a channel region 110 is also formed. As shown below, these regions may be used as channel regions 110 and source/drain regions 108 of independent transistors or as a single coupled transistor simply by the formation of the contacts 1702 and the collets 1704. When used as independent transistors, because the source/drain regions 108 are formed on the same fin structure 104, the transistors may exhibit very similar electrical characteristics.

Figure 24:
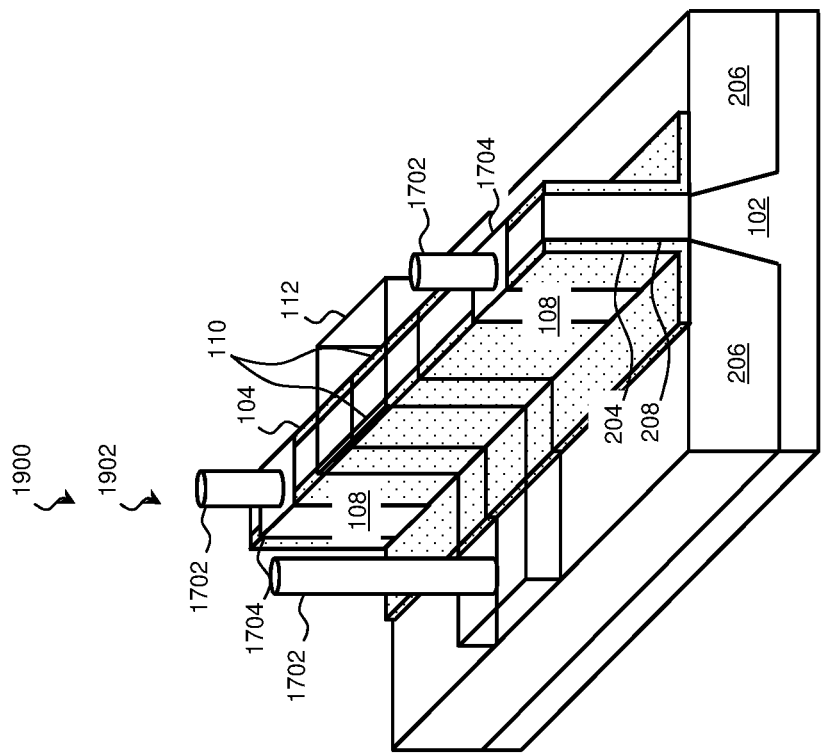
Figure 23:
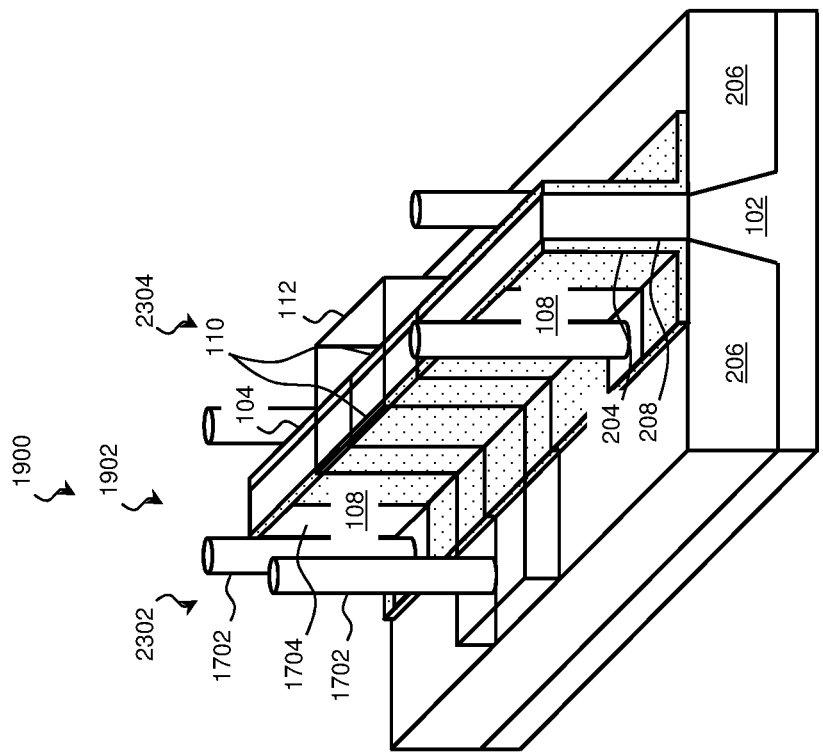

After the removal of the sheet layer 204, the planarization layer 2002 may be removed as illustrated in block 1808 of FIG. 18 and FIG. 22. Referring to block 1810, the workpiece 1900 may be provided for gate stack 112 fabrication and other subsequent processing such as the processing described in blocks 520-524 of FIG. 5 or any other suitable fabrication processes. As described above, the double gate FinFET 1902 may be implemented as two independent transistors (transistors 2302 and 2304) as shown in FIG. 23 or as a single transistor as shown in FIG. 24. In the embodiment of FIG. 23, the contacts 1702 coupled to the source/drain regions 108 on either side surface of the rib structure 208 are electrically independent, whereas in the embodiment of FIG. 24, the contacts 1702 and collets 1704 electrically couple the source/drain regions 108 on the side surfaces of the rib structure 208. It is understood that a single workpiece 1900 may include FinFETs in both configurations.

Figure 25:
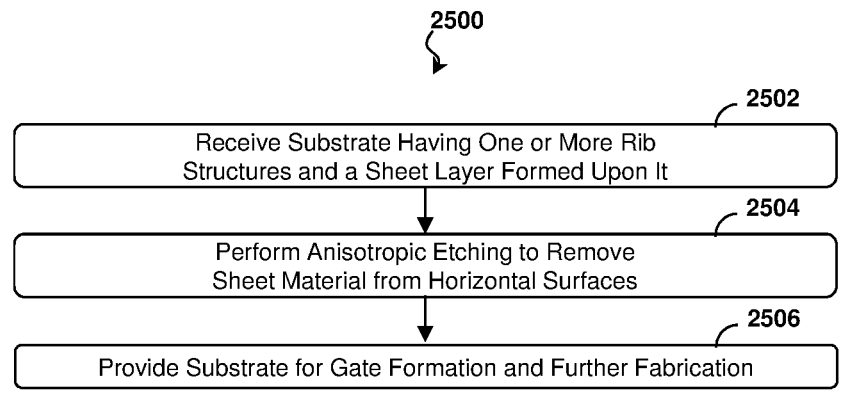
FIG. 25 is a flow diagram of an exemplary method for forming a double-gate FinFET device using an anisotropic etching process according to various aspects of the present disclosure.

A double-gate thin-sheet FinFET 1902 device may also be formed without the use of a planarization layer 2002 using an anisotropic (directional) etch as shown in FIGS. 25-29. FIG. 25 is a flow diagram of an exemplary method 2500 for forming a double-gate FinFET device 1902 using an anisotropic etching process according to various aspects of the present disclosure. It is understood that additional steps can be provided before, during, and after the steps of method 2500, and that some of the steps described can be replaced or eliminated for other embodiments of the method. FIGS. 26-29 are perspective views of a portion of a workpiece 2600 undergoing a method of forming a double-gate FinFET device 1902 according to various aspects of the present disclosure. FIGS. 26-29 have been simplified for the sake of clarity and to better illustrate the concepts of the present disclosure. Additional features may be incorporated into the workpiece 2600, and some of the features described below may be replaced or eliminated for other embodiments of the workpiece 2600.

Referring to block 2502 of FIG. 25 and to FIG. 26, a workpiece 2600 is received that includes a substrate 102 having a rib structure 208 and a sheet layer 204 formed upon it. In that regard, the substrate 102 may be substantially similar to that of FIG. 14, and the forming of the rib structure 208 and the sheet layer 204 may be performed substantially as described in blocks 502-516 of FIG. 5 or by any other suitable technique. Referring to block 2504 of FIG. 25 and to FIG. 27, an anisotropic etching process is performed to etch the horizontal surfaces of the sheet layer 204. Exemplary anisotropic etching processes include dry etching as well as wet etching, RIE, and other suitable etching processes. As shown in FIG. 27, the anisotropic etching process may remove the portion of the sheet layer 204 on the top surface of the fin structure 104 as well as the portion on the top surface 210 of the substrate 102 and/or isolation feature 206. Thus, the etching process of block 2404 may be performed as part of the etching of the sheet layer 204 described in block 518 of FIG. 5. A pair of source/drain regions 108 and an interposed channel region 110 are formed on one side surface of the rib structure 208 and are visible in FIG. 27. On the opposing side surface, obscured by the perspective of FIG. 27, a symmetrical arrangement of source/drain regions and a channel region 110 is also formed.

Figure 29:
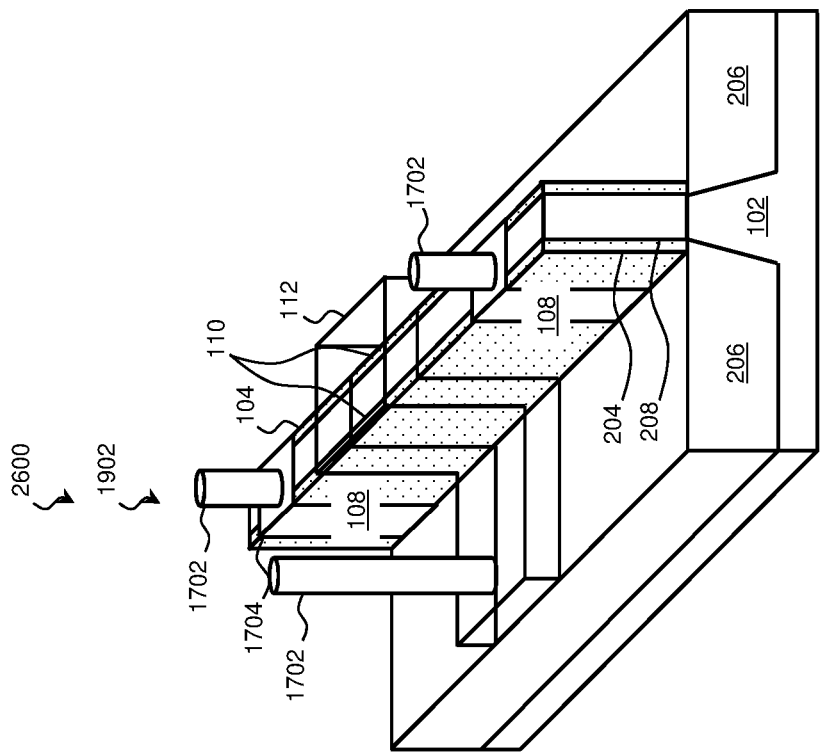
Figure 28:
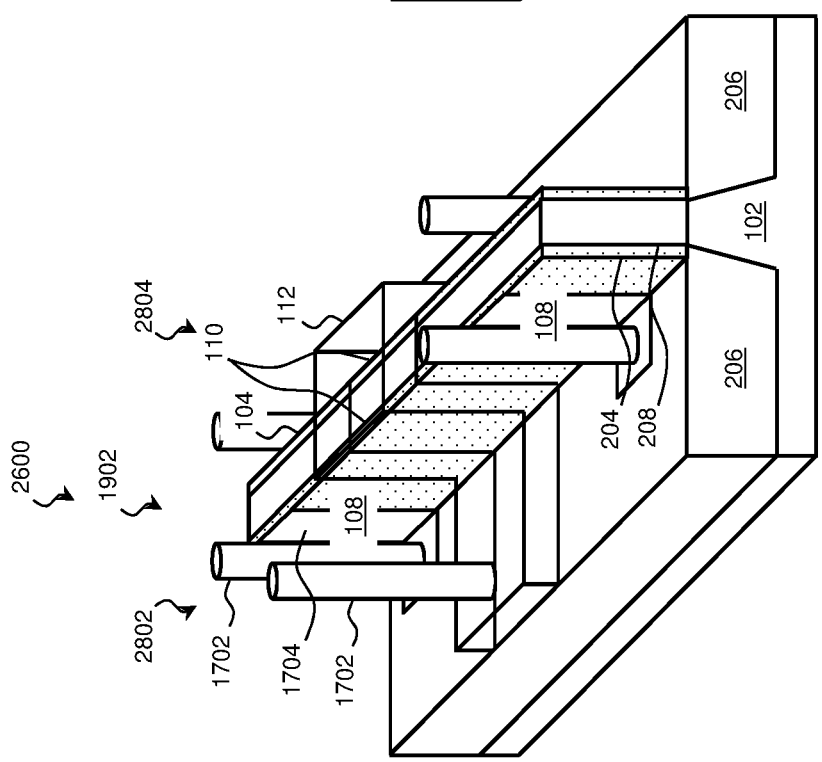

Referring to block 2406, after the partial removal of the sheet layer 204, the workpiece 2600 may be provided for gate stack 112 fabrication and other subsequent processing such as the fabrication process described in blocks 520-524 of FIG. 5 or any other suitable processes. As described above, the double gate FinFET 1902 may be implemented as two independent transistors (transistors 2802 and 2804) as shown in FIG. 28 or as a single transistor as shown in FIG. 29. A single workpiece 2600 may include FinFETs 1902 in both configurations.

Figure 30:
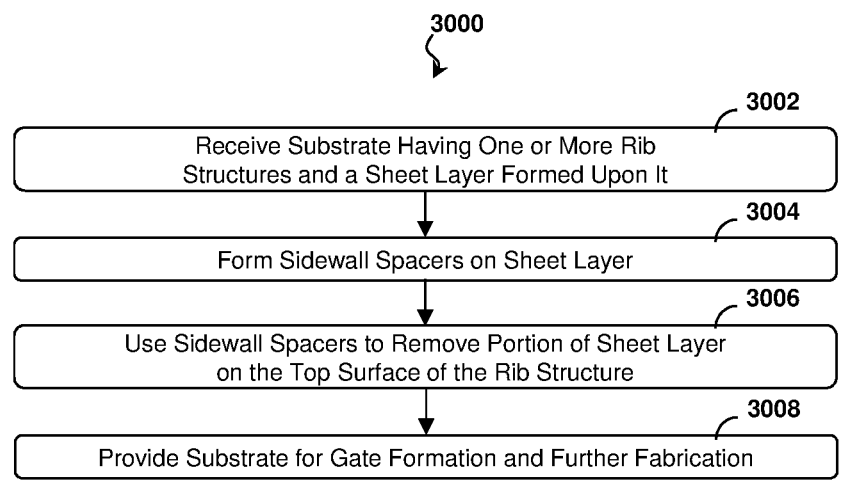
FIG. 30 is a flow diagram of an exemplary method for forming a double-gate FinFET device using sidewall spacers according to various aspects of the present disclosure.

A final exemplary technique for forming a double-gate thin-sheet FinFET device 1902 is described with reference to FIGS. 30-36. FIG. 30 is a flow diagram of an exemplary method 3000 for forming a double-gate FinFET device 1902 using sidewall spacers according to various aspects of the present disclosure. It is understood that additional steps can be provided before, during, and after the steps of method 3000, and that some of the steps described can be replaced or eliminated for other embodiments of the method. FIGS. 31-36 are perspective views of a portion of a workpiece 3100 undergoing a method of forming a double-gate FinFET device 1902 according to various aspects of the present disclosure. FIGS. 31-36 have been simplified for the sake of clarity and to better illustrate the concepts of the present disclosure. Additional features may be incorporated into the workpiece 3100, and some of the features described below may be replaced or eliminated for other embodiments of the workpiece 3100.

Referring to block 3002 of FIG. 30 and to FIG. 31, a workpiece 3100 is received that includes a substrate 102 having a rib structure 208 and a sheet layer 204 formed upon it. In that regard, the substrate 102 may be substantially similar to that of FIG. 14, and the forming of the rib structure 208 and the sheet layer 204 may be performed substantially as described in blocks 502-516 of FIG. 5 or by any other suitable technique. Referring to block 3004 of FIG. 30 and to FIG. 32, sidewall spacers 3202 are formed on the vertical portions of the sheet layer 204. The sidewall spacers 3202 protect underlying areas of the sheet layer 204 from a subsequent etching process and expose for etching a portion of the sheet layer 204 on the top surface of the fin structure 104 and a portion of the sheet layer 204 on the top surface 210 of the substrate 102 and/or isolation feature 206. As can be seen from FIG. 32, by controlling the width of the sidewall spacers 3202 (indicated by arrow 3204), the amount of the sheet layer 204 left on the top surface 210 of the substrate 102 and/or isolation feature 206 can be controlled. This allows the operator to control the channel width of the FinFET devices 1902, and a single workpiece 3100 may have multiple FinFET devices 1902 of varying channel widths.

Any of a number of techniques may be used to form the sidewall spacers 3202. For example, in some embodiments, a masking material is deposited conformally on the sheet layer 204 and an anisotropic etch is used to remove the horizontal portions of the masking material leaving the sidewall spacers 3202. Suitable conformal deposition techniques include CVD and HDP-CVD. Other techniques for forming the sidewall spacers 3202 are both contemplated and provided for. Suitable materials for the sidewall spacers 3202 include dielectrics such as a semiconductor oxide, a semiconductor nitride, a semiconductor oxynitride, a semiconductor carbide, and/or other dielectrics.

Figure 34:
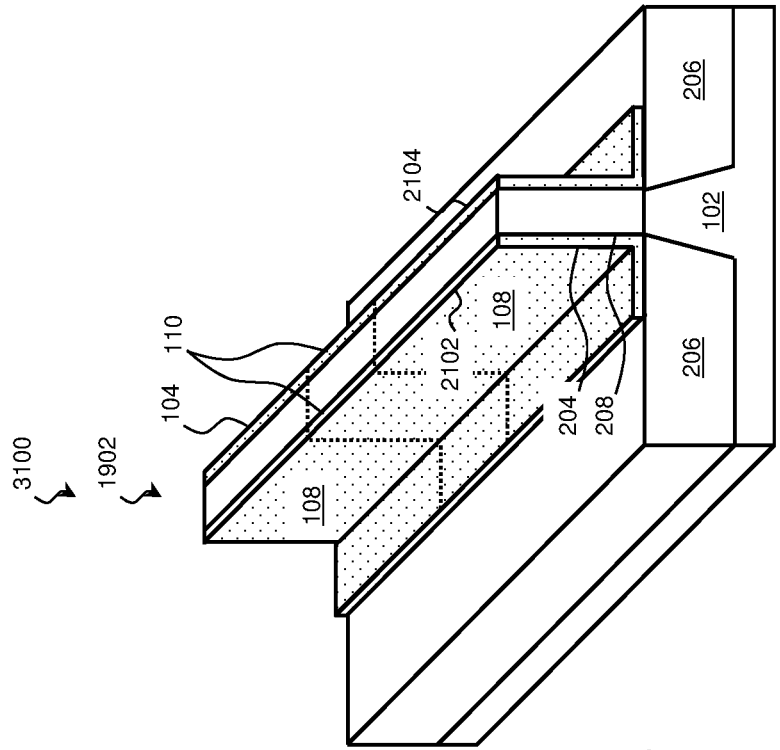
Figure 33:
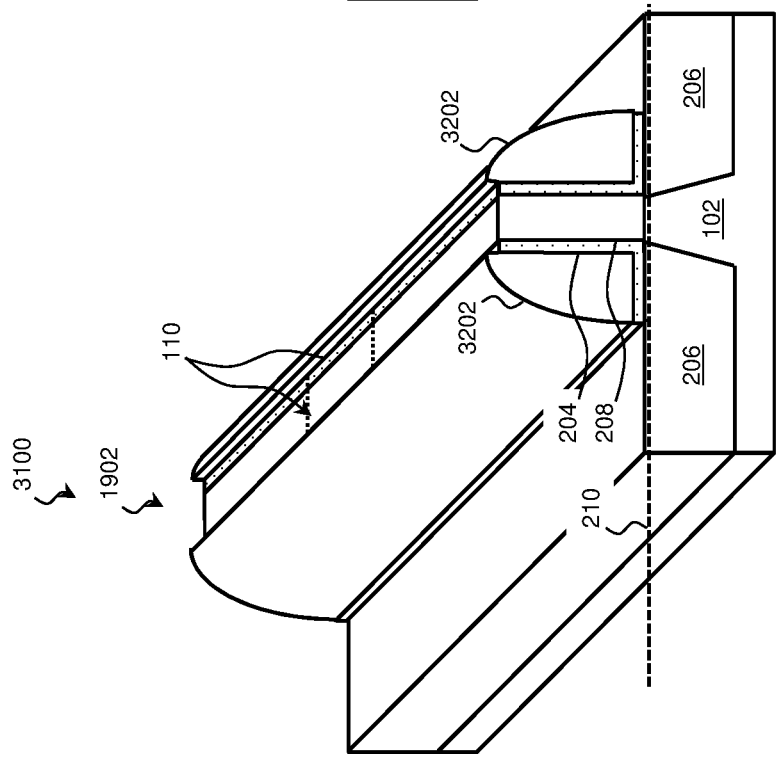

Referring to block 3006 of FIG. 30 and to FIG. 33, the exposed portions of the sheet layer 204 are removed from the top surface of the rib structure 208 and the top surface 210 of the substrate 102 and/or isolation features 206. In an exemplary embodiment, the exposed portions are removed by an etching process. The etching of the sheet layer 204 may include any suitable etching technique, such as dry etching, wet etching, reactive ion etching, and/or other etching methods (e.g., reactive ion etching). One advantage of using sidewall spacers 3202 is that they allow the use of both anisotropic and isotropic etching techniques in block 3006. Referring to FIG. 34, the sidewall spacers 3202 are removed from the sheet layer 204. With the sidewall spacers 3202 removed, a pair of source/drain regions 108 and an interposed channel region 110 formed on one side surface of the rib structure 208 are visible in FIG. 34. On the opposing side surface, obscured by the perspective of FIG. 34, a symmetrical arrangement of source/drain regions and a channel region 110 is also formed.

Referring to block 3008 of FIG. 30, after the removal of the sidewall spacers 3202, the workpiece 3100 may be provided for gate stack 112 fabrication and other subsequent processing such as the processing described in blocks 520-524 of FIG. 5 or any other suitable fabrication processes. As described above, the double gate FinFET 1902 may be implemented as two independent transistors (transistors 3502 and 3504) as shown in FIG. 35 or as a single transistor as shown in FIG. 36. A single workpiece 3100 may include FinFETs 1902 in both configurations.

Figure 37:
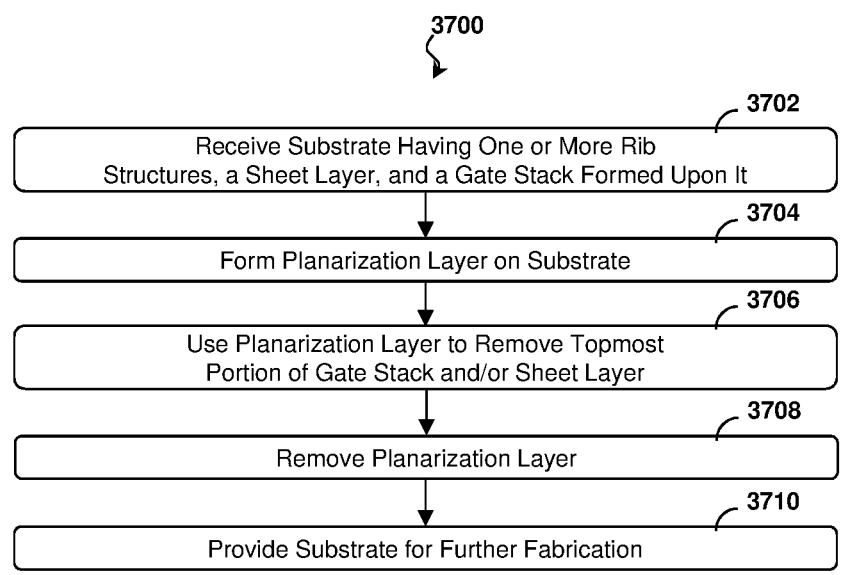
FIG. 37 is a flow diagram of an exemplary method for forming a double-device FinFET according to various aspects of the present disclosure.

Because forming multiple devices on a single fin structure 104 improves device density and produces more uniform performance across devices, many of the above embodiments, such as those of FIGS. 23, 28, and 35, include two FinFET transistors formed on opposing sides of a rib structure 208. Whereas the above examples shared a common gate stack 112, in some embodiments, two electrically-independent FinFETs with independent gate stacks are formed on a single rib structure 208. An exemplary double-device embodiment is described with reference to FIGS. 37-41. FIG. 37 is a flow diagram of an exemplary method 3700 for forming a double-device FinFET 3802 according to various aspects of the present disclosure. It is understood that additional steps can be provided before, during, and after the steps of method 3700, and that some of the steps described can be replaced or eliminated for other embodiments of the method. FIGS. 38-41 are perspective views of a portion of a workpiece 3800 undergoing a method of forming a double-device FinFET 3802 according to various aspects of the present disclosure. FIGS. 38-41 have been simplified for the sake of clarity and to better illustrate the concepts of the present disclosure. Additional features may be incorporated into the workpiece 3800, and some of the features described below may be replaced or eliminated for other embodiments of the workpiece 3800.

Figure 38:
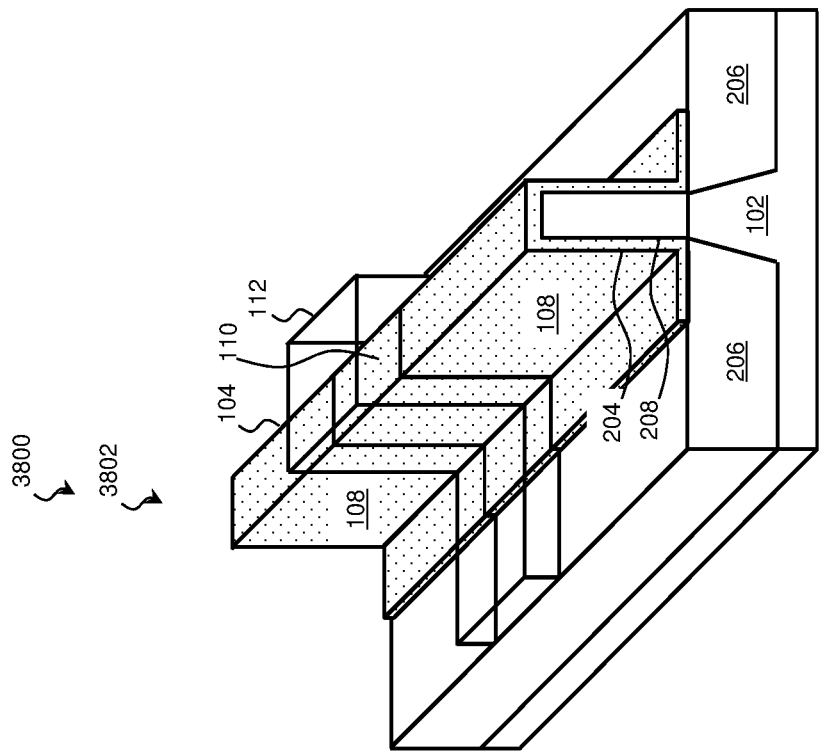

Referring to block 3702 of FIG. 37 and to FIG. 38, a workpiece 3800 is received that includes a substrate 102 having a rib structure 208 and a sheet layer 204 formed upon it. A gate stack 112 is formed overwrapping a channel region 110 of the sheet layer 204. In that regard, the substrate 102 may be substantially similar to that of FIG. 16, and the forming of the rib structure 208, the sheet layer 204, and the gate stack 112 may be performed substantially as described in blocks 502-522 of FIG. 5 or by any other suitable technique.

Figure 39:
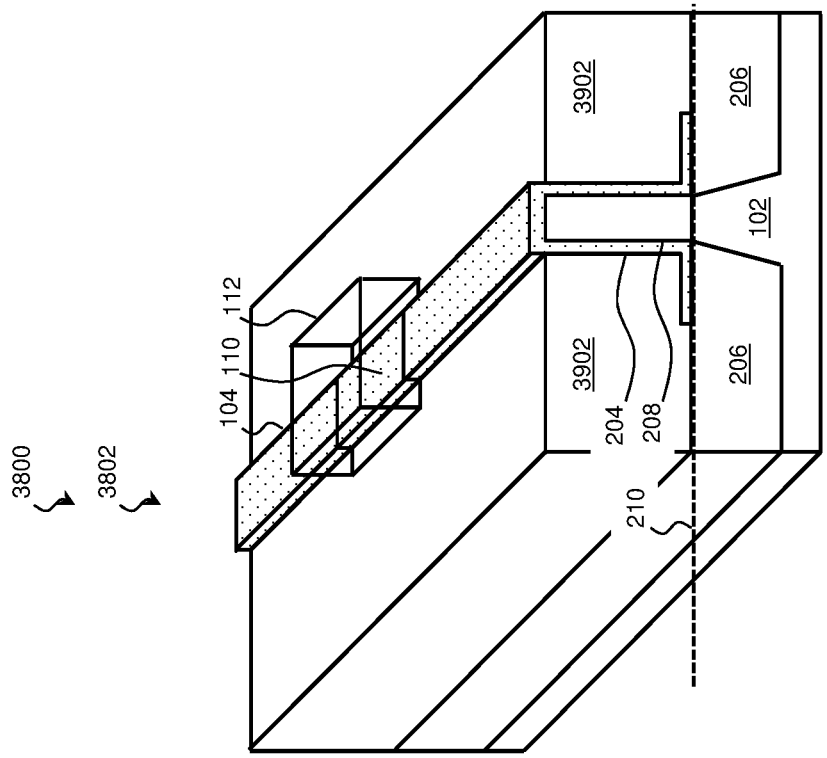

Referring to block 3704 of FIG. 30 and to FIG. 39, a planarization layer 3902 is formed on the substrate 102. The planarization layer 3902 is used to control a subsequent etching or polishing process and may be selected for its mechanical and/or chemical stability. For example, in an embodiment, the planarization layer 3902 includes a low-temperature oxide deposited by CVD. Other suitable processes for forming the planarization layer 3902 include high-density plasma CVD (HDP-CVD), physical vapor deposition (PVD), and/or other suitable deposition processes. As the planarization layer 3902 is used to control a subsequent etching or polishing process, it may be formed to a thickness (measured perpendicular to the top surface 210 of the substrate 102 and/or isolation feature 206) configured to expose a top portion of the fin structure 104 and a top portion of the gate stack 112 as shown in the illustrated embodiment. In alternate embodiments, the planarization layer 3902 is first formed to cover the fin structure 104 and gate stack 112 and is thinned to expose the fin structure 104 and the gate stack 112 as part of the removal process of block 3706.

Referring to block 3706 of FIG. 37 and to FIG. 40, the topmost portion of the gate stack 112 and the portion of the sheet layer 204 on the topmost surface of the rib structure 208 are removed. In an exemplary embodiment, a CMP process removes the exposed portions of the sheet layer 204 and the gate stack using the planarization layer 3902 as a CMP stop material. In further exemplary embodiments, a chemical etching process such as a wet etching, dry etching, RIE, and/or other etching process is used to remove the portion of the sheet layer 204 and the gate stack 112 exposed by the planarization layer 3902. The removal process of block 3706 may completely remove the topmost portion of the gate stack 112 so that the remaining portions of the gate stack 112 on the side surfaces of the rib structure 208 (e.g., portions 4002 and 4004) are electrically uncoupled. This creates two independent gate structures. Likewise, the removal process of block 3706 may completely remove the topmost portion of the sheet layer 204 so that the remaining portions of the sheet layer 204 on the side surfaces of the rib structure 208 (e.g., portions 4006 and 4008) are electrically uncoupled.

After the separating the gate stack 112 and the sheet layer 204, the planarization layer 3902 may be removed as illustrated in block 3708 of FIG. 37 and FIG. 41. With the planarization layer 3902 removed, a pair of source/drain regions 108 and an interposed channel region 110 formed on one side surface of the rib structure 208 are visible in FIG. 41. On the opposing side surface, obscured by the perspective of FIG. 41, a symmetrical arrangement of source/drain regions and a channel region 110 is also formed. Referring still to FIG. 41, the substrate may also be provided for subsequent fabrication processes as illustrated in block 3710. In an exemplary embodiment, these subsequent fabrication processes include the formation of contacts 1702 and collets 1704 as well as other fabrication processes.

Figure 42:
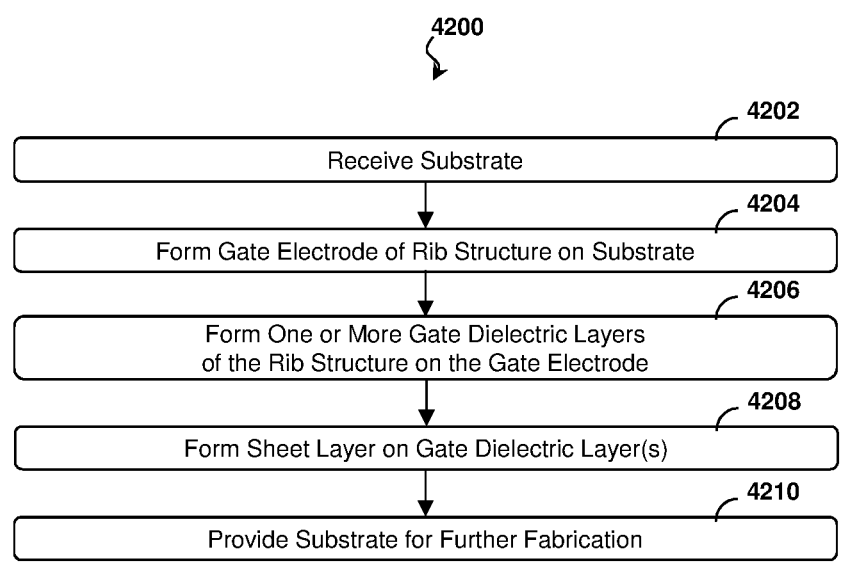
FIG. 42 is a flow diagram of an exemplary method for forming an inner-gate FinFET according to various aspects of the present disclosure.

As discussed above, by forming the channel region on a sheet layer 204 wrapped around a projecting rib structure 208, a variety of novel device structures may be fabricated. While many of the above examples include an insulating rib structure 208, a dielectric rib structure 208, or a semiconductor rib structure 208, portions of the rib structure 208 may also include a conductor. An exemplary embodiment in which a conductor within the rib structure 208 is used to form a second, independent gate is described with respect to FIGS. 42-50. FIG. 42 is a flow diagram of an exemplary method 4200 for forming an inner-gate FinFET 4302 according to various aspects of the present disclosure. It is understood that additional steps can be provided before, during, and after the steps of method 4200, and that some of the steps described can be replaced or eliminated for other embodiments of the method. FIGS. 43-50 are perspective views of a portion of a workpiece 4300 undergoing a method of forming an inner-gate FinFET according to various aspects of the present disclosure. FIGS. 43-50 have been simplified for the sake of clarity and to better illustrate the concepts of the present disclosure. Additional features may be incorporated into the workpiece 4300, and some of the features described below may be replaced or eliminated for other embodiments of the workpiece 4300.

Figure 43:
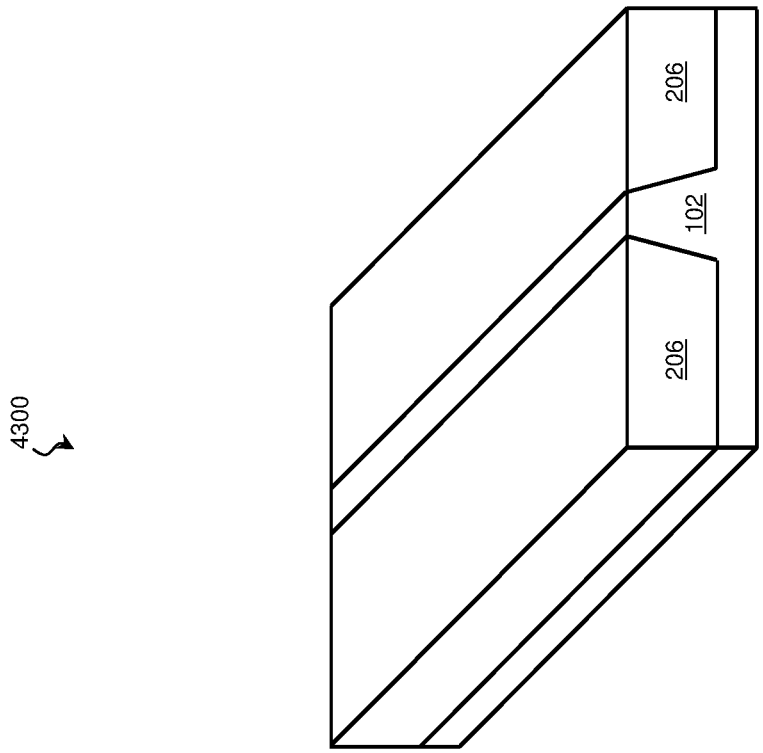

Referring to block 4202 of FIG. 42 and to FIG. 43, a workpiece 4300 is received that includes a substrate 102, substantially similar to the substrates of FIGS. 10 and/or 13. In that regard, the substrate 102 may include one or more isolation features 206 and/or an isolation layer 1102. In the illustrated embodiment, the rib structure 208 has not yet been formed. However, in some embodiments, the received substrate includes a precursor, a first layer of the rib structure 208 already formed upon the substrate 102. The precursor may be used to align rib structure 208 and/or to aid bonding of subsequent layers of the rib structure 208 to the substrate 102.

Figure 44:
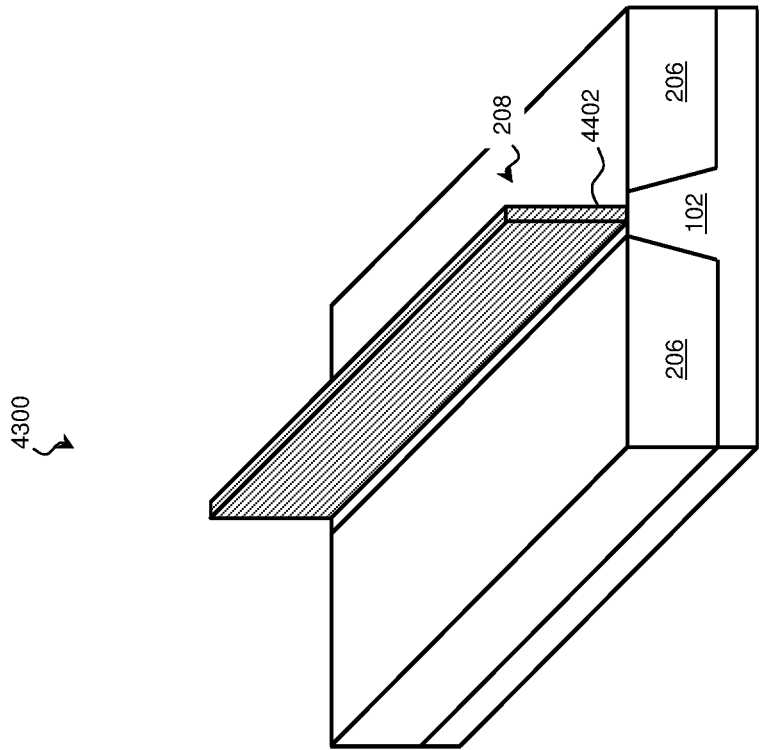
FIGS. 43-50 are perspective views of a portion of a workpiece undergoing a method of forming an inner-gate dual gate FinFET according to various aspects of the present disclosure.

Referring to block 4204 of FIG. 42 and to FIG. 44, a gate electrode layer 4402 of the rib structure 208 is formed on the substrate. The gate electrode layer 4402 may include any suitable conductive material such as polysilicon and/or metals including aluminum, copper, titanium, tantalum, tungsten, molybdenum, tantalum nitride, nickel silicide, cobalt silicide, TiN, WN, TiAl, TiAlN, TaCN, TaC, TaSiN, metal alloys, other suitable materials, and/or combinations thereof. In some embodiments, a polysilicon-containing gate electrode layer 4402 is deposited via a low-pressure CVD (LPCVD) process or a plasma-enhanced CVD (PECVD) process. In some embodiments, a metal-containing gate electrode layer 4402 is deposited by a damascene process. In one such embodiment, a masking layer (such as a semiconductor oxide or a semiconductor nitride masking layer) is formed and patterned to define a recess for the gate electrode layer 4402. One or more layers of metal are then deposited within the recess. For example, a tungsten-containing liner may be deposited and a copper-containing material may be deposited on the liner. The tungsten liner may prevent copper from diffusing into the substrate 102. Conductive material outside the recess is removed by CMP or other processes and the masking layer is removed leaving the gate electrode layer 4402. It is understood that these processes are merely exemplary and other techniques for forming the gate electrode layer 4402 are both contemplated and provided for.

Figure 45:
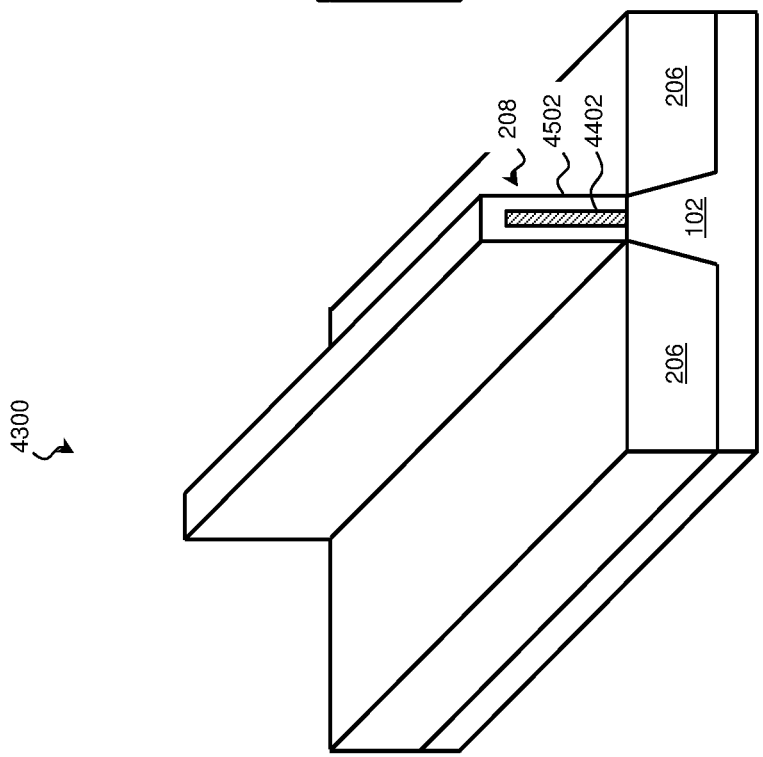

Referring to block 4206 of FIG. 42 and to FIG. 45, one or more gate dielectric layers 4502 of the rib structure 208 are formed on the gate electrode layer 4402. The gate dielectric layers 4502 may include any suitable dielectric material including a semiconductor oxide, a semiconductor nitride, a semiconductor oxynitride, a semiconductor carbide, amorphous carbon, tetraethylorthosilicate (TEOS), other suitable dielectric material, and/or combinations thereof. In some embodiments, the one or more gate dielectric layers 4502 include a high-k dielectric material such as $HfO_2$, HfSiO, HfSiON, HfTaO, HfTiO, HfZrO, zirconium oxide, aluminum oxide, hafnium dioxide-alumina ($HfO_2$—$Al_2O_3$) alloy, other suitable high-k dielectric materials, and/or combinations thereof. The gate dielectric layers 4502 may be formed to any suitable thickness using any suitable process including ALD, CVD, HDP-CVD, PVD, spin-on deposition, and/or other suitable deposition processes.

In some embodiments, an interfacial layer is formed on the outermost gate dielectric layer 4502. The interfacial layer may include any suitable material configured to bond to the sheet layer 204 without disrupting the sheet layer 204. In that regard, suitable materials include semiconductor oxides, semiconductor nitrides, semiconductor oxynitrides, other suitable interfacial materials, and/or combinations thereof.

Figure 46:
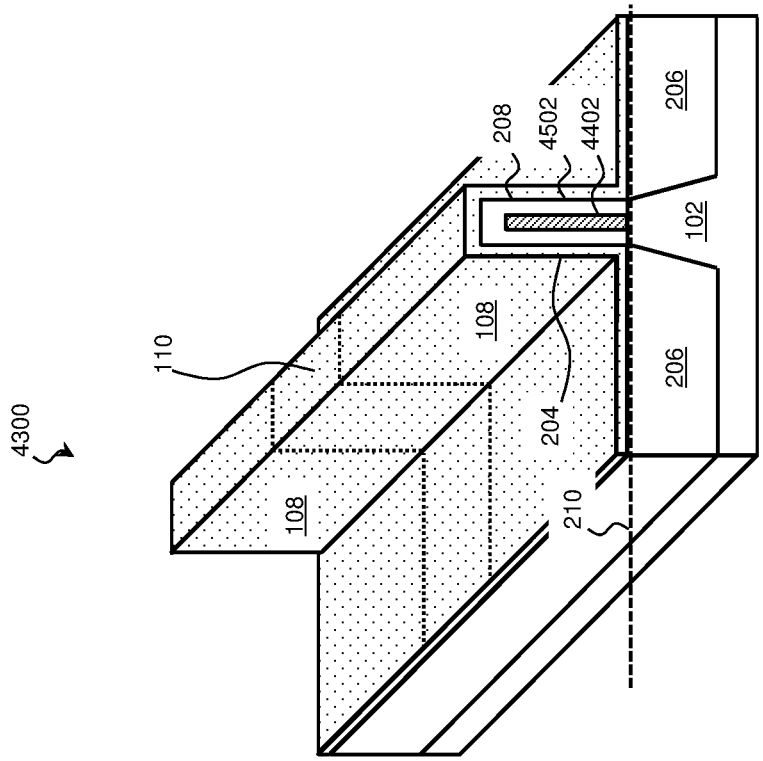

Referring to block 4208 of FIG. 42 and to FIG. 46, a sheet layer 204 is formed on the rib structure 208 and the substrate 102 and/or isolation feature 206 substantially as described in block 516 of FIG. 5. In the illustrated embodiments of FIG. 46, the sheet layer 204 is formed on each exposed surface (a topmost surface and two opposing side surfaces) of the rib structure 208. Along the length of the rib structure 208, the sheet layer 204 has source/drain regions 108 and a channel region 110 disposed between the source/drain regions 108.

Figure 47:
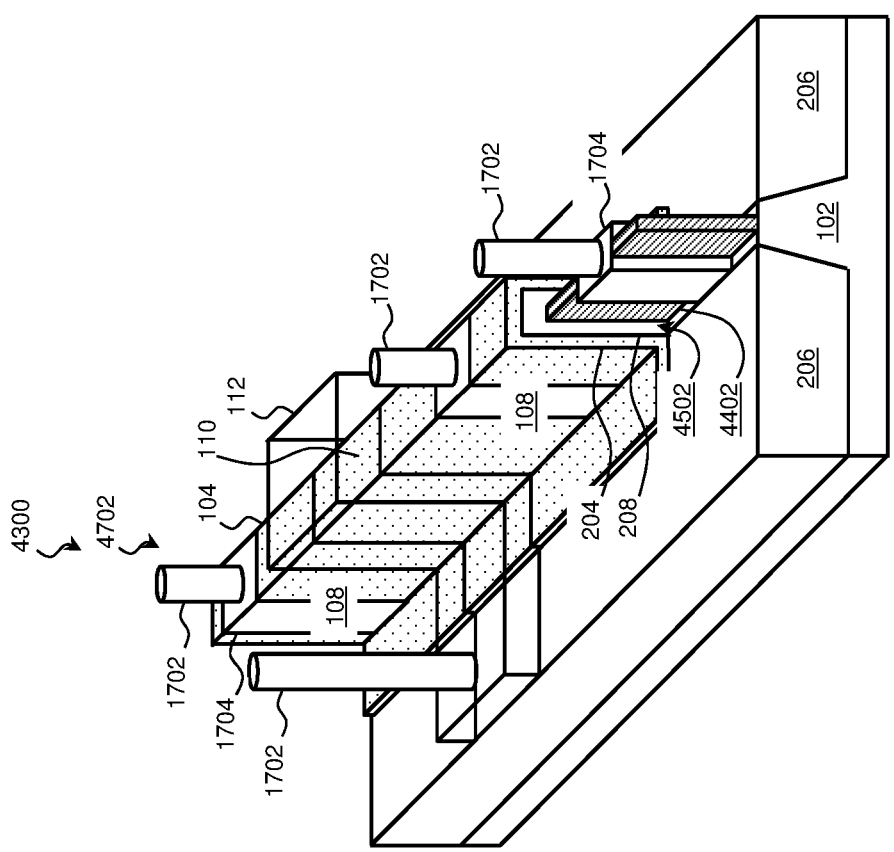

Referring to block 4210 of FIG. 42, the workpiece 4300 is provided for further fabrication. Method 4200 may be combined with the other exemplary methods disclosed herein to form a variety of devices. For example, in an embodiment, the workpiece 4300 undergoes the fabrication processes of blocks 518-524 of FIG. 5 to form a trigate FinFET 106 as illustrated in FIG. 47. It is noted that, in this embodiment and others, a contact 1702 and an optional collet 1704 are electrically coupled to the gate electrode layer 4402 of the rib structure 208. These allow the gate within the rib structure 208 to be controlled independently of the overwrapping gate stack 112. For example, the gate within the rib structure 208 may be used for back biasing, a technique used to adjust the $V_{th}$ of the device and tune it for power, performance, and/or consistency across devices.

Figure 48:
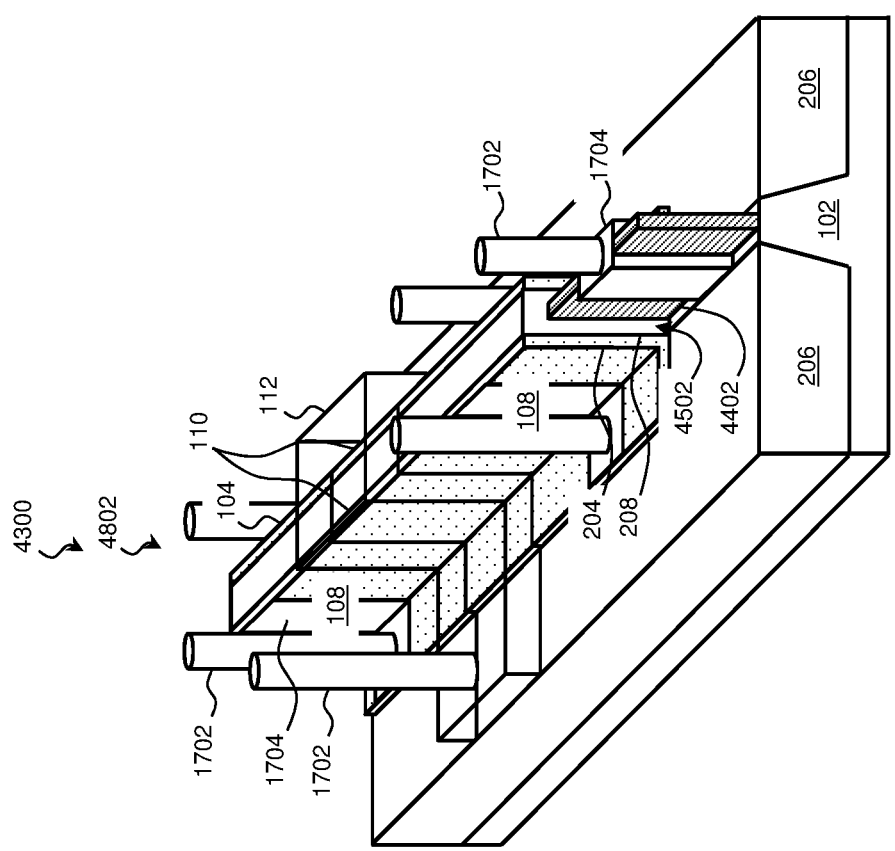
Figure 49:
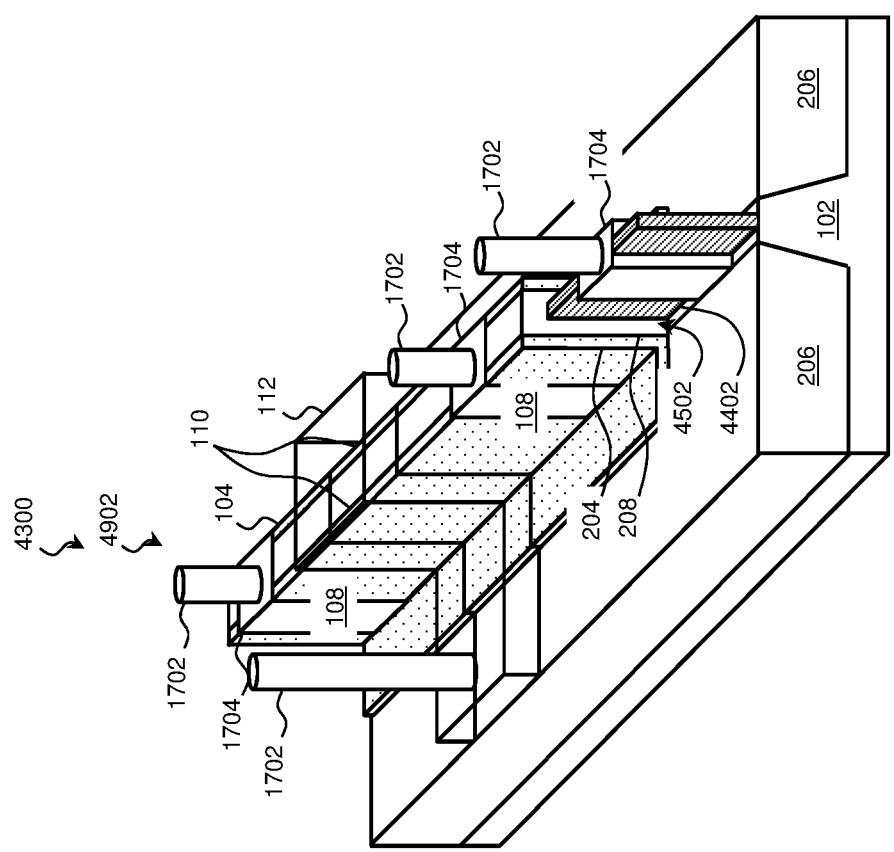
Figure 50:
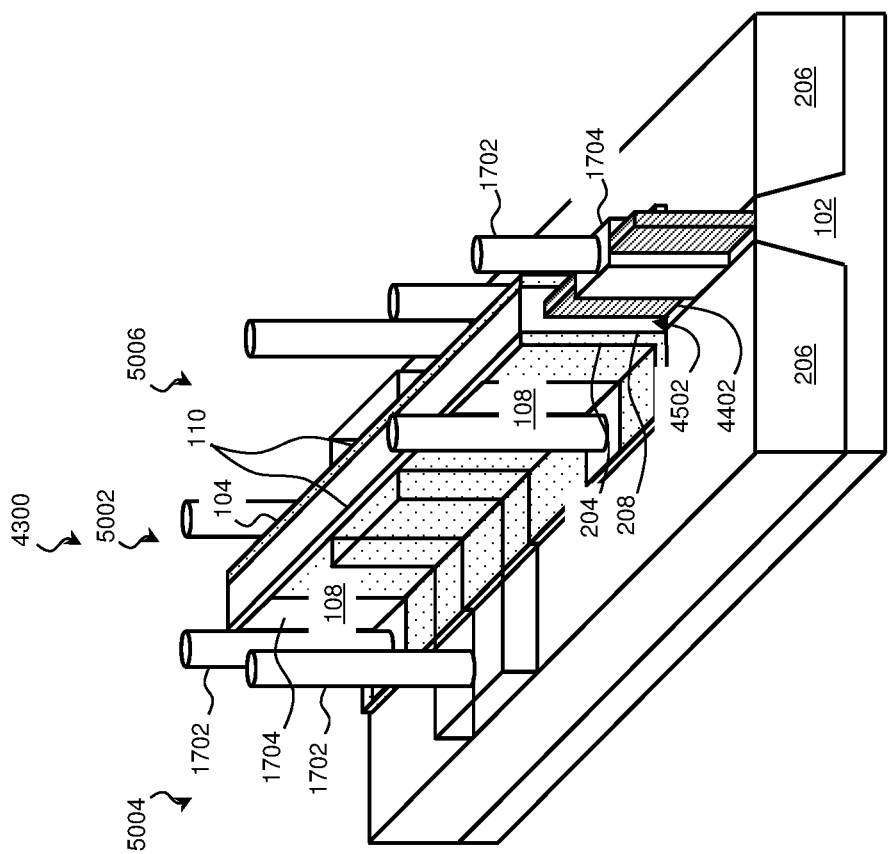

In a further embodiment, the workpiece 4300 undergoes the fabrication processes of blocks 1802-1810 of FIG. 18, blocks 2502-2506 of FIG. 25, and/or blocks 3002-3008 of FIG. 30 to form double-gate FinFETs 4802 and/or 4902 as illustrated in FIGS. 48 and 49, respectively. In the embodiment of FIG. 48, the contacts 1702 coupled to the source/drain regions 108 on either side surface of the rib structure 208 are electrically independent, whereas in the embodiment of FIG. 49, the contacts 1702 electrically couple the source/drain regions 108 on the opposing side surfaces of the rib structure 208. It is understood that a single workpiece 4300 may include FinFETs in both configurations. In a final exemplary embodiment, the workpiece 4300 undergoes the fabrication processes of blocks 3702-3710 of FIG. 37 to form a double-device FinFET 5002 having transistors 5004 and 5006 as illustrated in FIG. 50.

Figure 51:
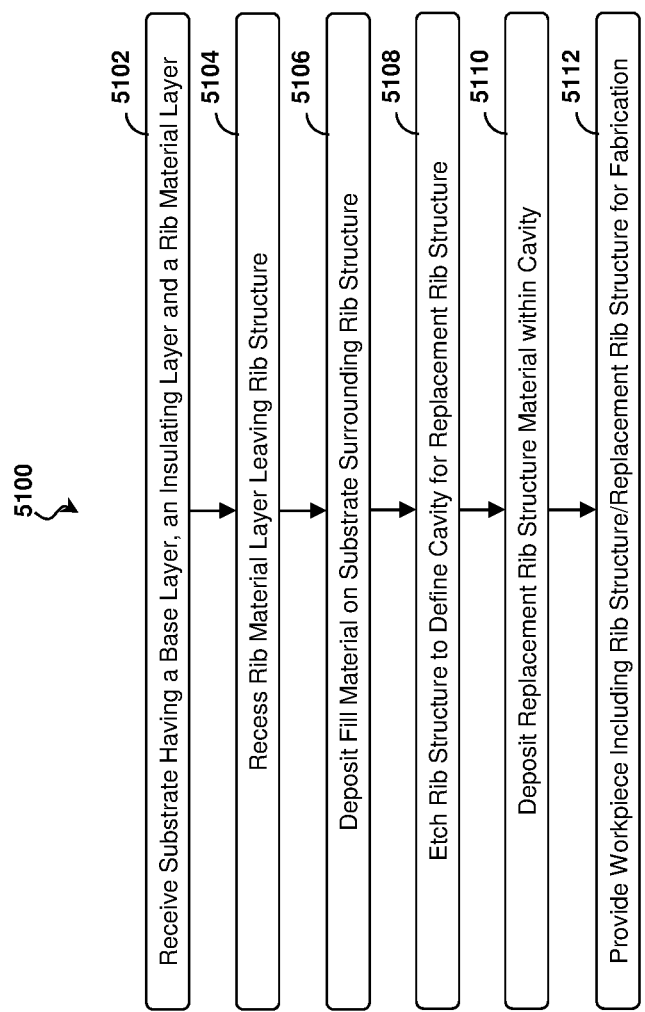
FIG. 51 is a flow diagram of an exemplary method for forming a fin structure on a multi-layer substrate according to various aspects of the present disclosure.

As described above, any suitable technique may be used to form the fin structure 208 on the substrate. Another set of techniques for forming a fin structure 208 will now be described with reference made to FIGS. 51-69. The techniques are well suited to forming a fin structure 208 on a semiconductor-on-insulator (SOI) type substrate 102. FIG. 51 is a flow diagram of an exemplary method 5100 for forming the fin structure 208 on the substrate 102 according to various aspects of the present disclosure. It is understood that additional steps can be provided before, during, and after the steps of method 5100, and that some of the steps described can be replaced or eliminated for other embodiments of the method. FIGS. 52-57 are perspective views of a portion of a workpiece 5200 undergoing the method 5100 of forming the fin structure 208 on the substrate according to various aspects of the present disclosure. Once formed, the fin structure 208 of the workpiece is suitable for use in any of the exemplary techniques for forming a FinFET. FIGS. 58-69 are perspective views of a portion of a workpiece 5200 having thin-film FinFETs formed thereupon according to various aspects of the present disclosure.

Figure 52:
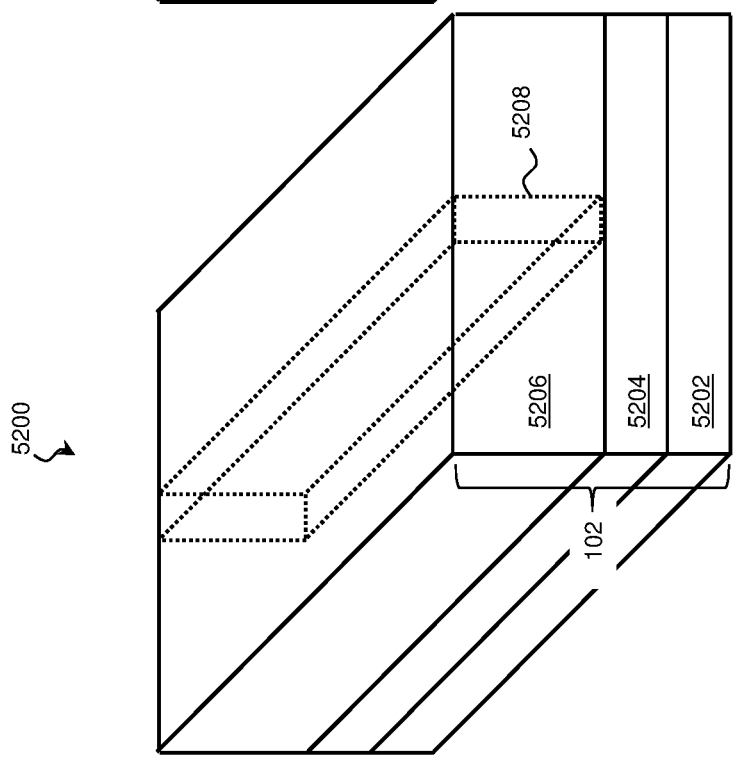

Referring first to block 5102 of FIG. 51 and to FIG. 52, a substrate 102 having a base layer 5202, an insulating layer 5204, and a rib material layer 5206 is received. Suitable base layers 5202 include semiconductor and/or non-semiconductor materials. Accordingly, in some examples, the base layer 5202 includes an elementary semiconductor material and/or a compound semiconductor material. The insulating layer 5204 is disposed on the base layer 5202 and may include any suitable insulating material such as a semiconductor oxide, a semiconductor nitride, a semiconductor oxynitride, a semiconductor carbide, and/or other suitable materials. In an exemplary embodiment, the insulating layer 5204 is a buried silicon oxide layer formed by SIMOX.

The rib material layer 5206 is disposed on the insulating layer 5204 and, similar to the rib structure 208 it is used to form, may include any suitable material. In various embodiments, the rib material layer 5206 includes a semiconductor material (e.g., an elementary semiconductor and/or a compound semiconductor), a dielectric material (e.g., a semiconductor oxide, a semiconductor nitride, a semiconductor oxynitride, a semiconductor carbide, FSG, and/or a low-K dielectric material), an insulator material (e.g., quartz, glass, etc.), a conductor (e.g., polysilicon, metal, metal alloys, etc.), and/or combinations thereof. For reference, the portion of the rib material layer 5206 that is used to form a rib structure 208 is indicated by the dashed box 5208.

Figure 53:
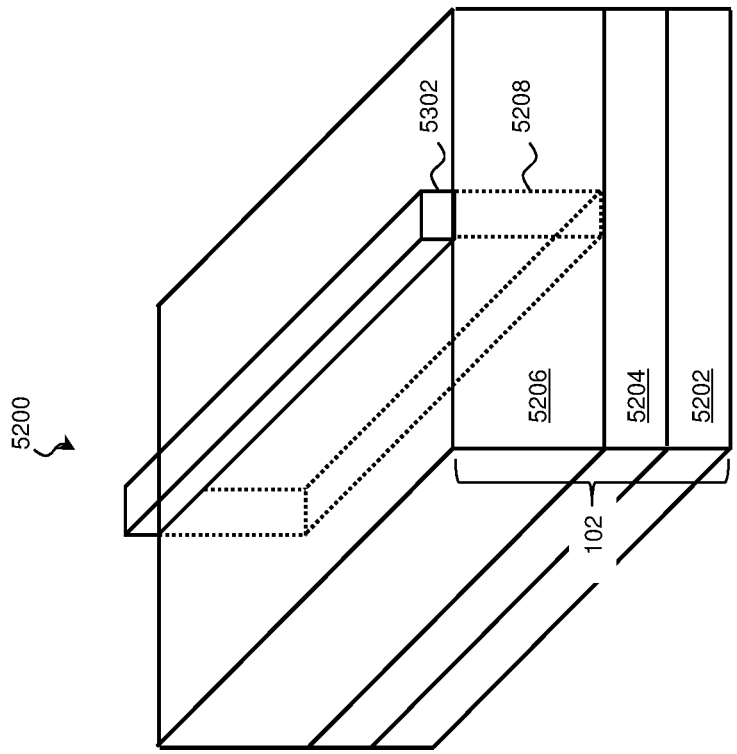
FIGS. 52-57 are perspective views of a portion of a workpiece undergoing the method of forming a fin structure on a multi-layer substrate according to various aspects of the present disclosure.

Referring to block 5104 of FIG. 51, areas of the rib material layer 5206 surrounding the rib structure region are recessed. In some embodiments, this includes forming a photoresist layer 5302 over the rib material layer 5206 and developing it to expose the portions of the rib material layer 5206 that are to be recessed by the etchant. In the embodiment of FIG. 53, the photoresist layer 5302 has been patterned to leave the photoresist material over the rib structure region. Alternatively, a photolithographic process may be implemented, supplemented, or replaced by other methods such as maskless photolithography, electron-beam writing, and ion-beam writing.

Referring still to block 5104 of FIG. 51 and referring to FIG. 8, an etching process is performed on the substrate 102. The etching may include any suitable etching process including dry etching, wet etching, and/or other etching methods (e.g., reactive ion etching (RIE)). For example, in an embodiment, the substrate 102 is etched in a dry etching process using a fluorine-based etchant. In some embodiments, etching includes multiple etching steps with different etching chemistries, each targeting a particular material of the substrate 102. The etching is configured to produce rib structures 208 of any suitable height and width extending above the remainder of the substrate 102.

The rib structure 208 formed in blocks 5102 and 5104 may be used "as is" to form an active device such as the FinFETS described above. Additionally or in the alternative, a portion of the rib structure 208 may be replaced by a different material before being used to form an active device. An exemplary rib structure replacement technique is described in blocks 5106-5110.

Figure 55:
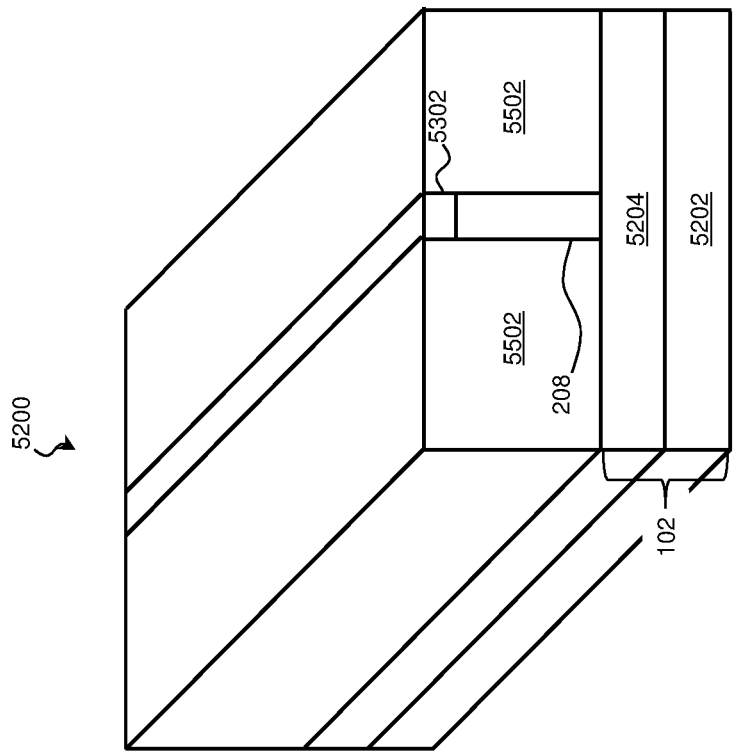
Figure 54:
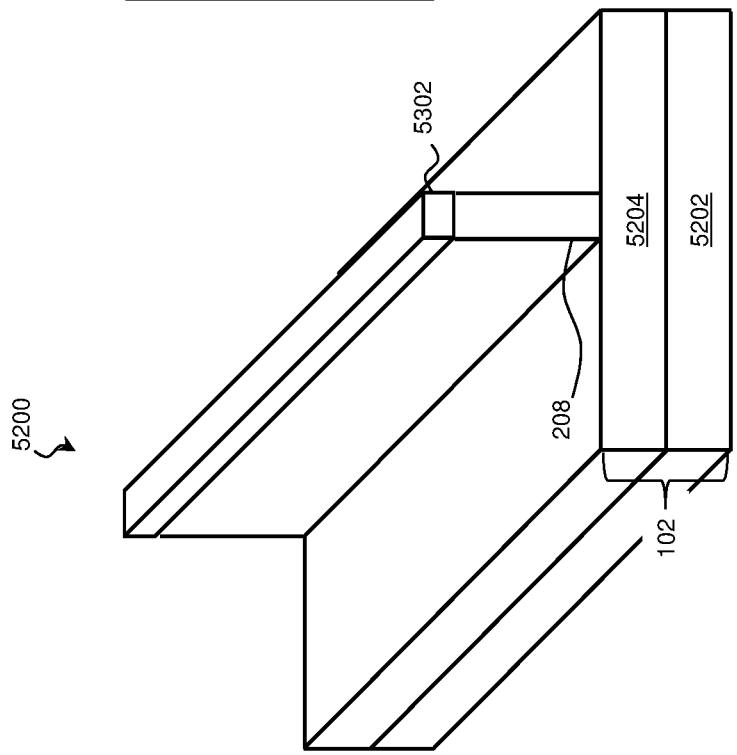

Referring to block 5106 of FIG. 51 and to FIG. 55, a dielectric fill material 5502 is formed on the substrate 102 and surrounding the existing rib structure 208. A chemical mechanical polish/planarization (CMP) process may be performed on the dielectric fill material 1102 following its deposition.

Figure 56:
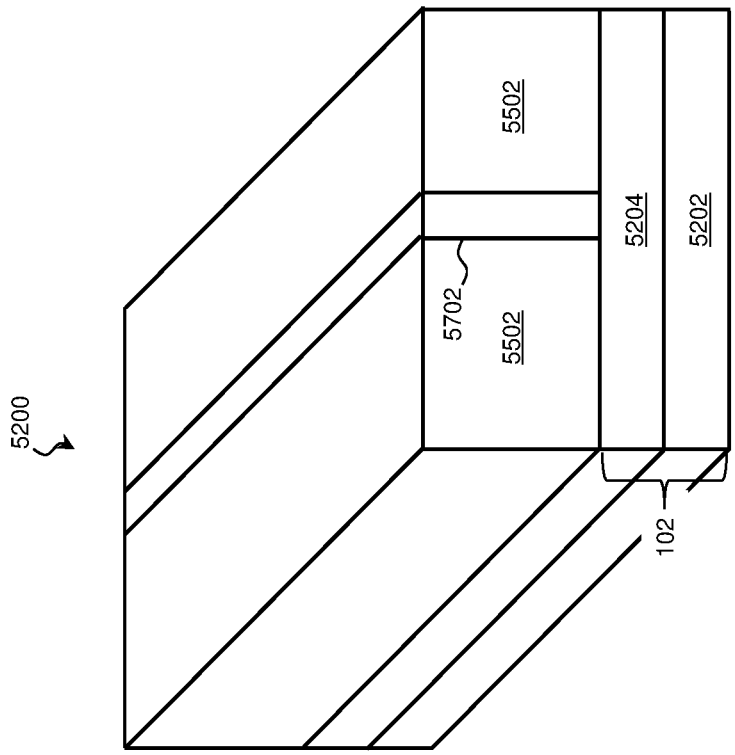

Referring to block 5108 of FIG. 51 and to FIG. 56, the rib structure 208 and any remaining resist 5302 are etched to define a cavity 5602 for the replacement rib structure. The etching may include any suitable etching process including dry etching, wet etching, and/or other etching methods such as RIE. The etching process is configured to remove some or all of the rib structure 208, and in the illustrated embodiment, the rib structure 208 is completely removed by the etching process. In an alternative embodiment, a portion of the rib structure 208 remains after etching to act as a seed layer for the formation of the replacement rib structure.

Figure 57:
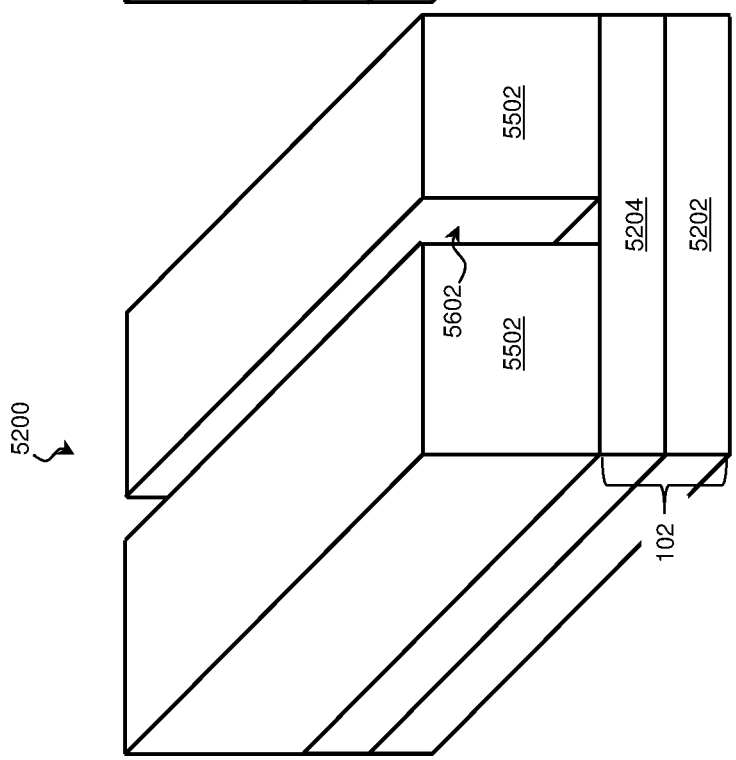

Referring to block 5110 of FIG. 5 and to FIG. 57, a replacement rib structure 5702 is formed in the cavity 5602 left by the removal of the original rib structure 208. The technique used to form the replacement rib structure 5702 may depend on the materials of the replacement rib structure 5702 and in that regard, suitable materials include conductors, semiconductors, and dielectrics such as semiconductor oxides, semiconductor nitrides, semiconductor oxynitride, FSG, and/or a low-K dielectric materials. In some embodiments, a conductor-containing replacement rib structure 5702 is formed by PVD (e.g., sputtering, evaporating, electroplating, etc.), CVD, and/or other deposition processes. In some embodiments, a semiconductor-containing replacement rib structure 5702 is formed by an epitaxial growth process. In some embodiments, a dielectric-containing rib structure 5702 is formed using a HDP-CVD process, a sub-atmospheric CVD (SACVD) process, a high-aspect ratio process (HARP), and/or a spin-on process. Forming the replacement rib structure 5702 may also include performing a chemical mechanical polish/planarization (CMP) process following the deposition of the replacement rib structure material. In an embodiment, forming the replacement rib structure 5702 also includes a thermal annealing process following the deposition of the rib structure material. The dielectric fill material 5504 is removed after the replacement rib structure 5702 is formed.

Figure 58:
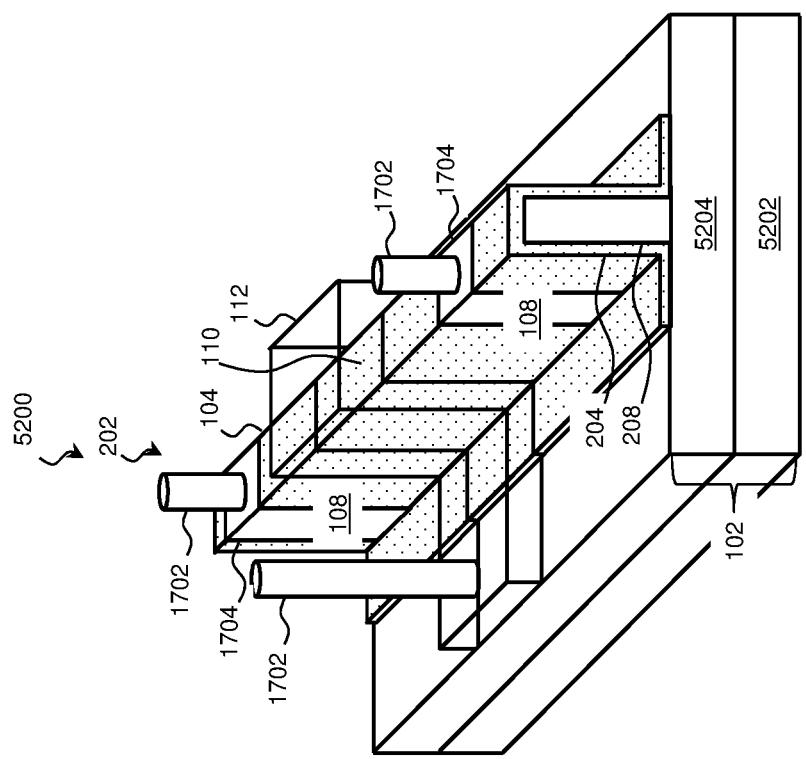

Referring to block 5112 of FIG. 5, the workpiece 5200 including the rib structure 208 and/or replacement rib structure 5702 is provided for further fabrication. Further fabrication may include any of the fabrication techniques described above. Various examples of the workpiece 5200 having undergone these techniques will now be described. Referring to FIG. 58, in an exemplary embodiment, the workpiece 5200 undergoes the process of blocks 516-524 of FIG. 5 to produce a trigate FinFET device 202. In many respects, the trigate FinFET device 202 is substantially similar to that described in the context of FIG. 17. For example, the trigate FinFET device 202 of FIG. 58 includes a sheet layer 204 disposed on the rib structure 208 and having source/drain regions 108 and a channel region 110 disposed upon it; a gate stack 112 disposed on the sheet layer 204; contacts 1702 electrically coupling the gate stack 112 and the source/drain regions 108 to other active and passive devices of the workpiece 5200, and/or collets 1704, where each is substantially similar to that of FIG. 17.

Referring to FIG. 59, in an exemplary embodiment, the workpiece 5200 undergoes the process of blocks 1802-1810 of FIG. 18 to produce a double gate FinFET 1902 implemented as two independent transistors (transistors 2302 and 2304). In many respects, the double gate FinFET device 1902 is substantially similar to that described in the context of FIG. 23. For example, the double gate FinFET device 1902 of FIG. 59 includes a sheet layer 204 disposed on the rib structure 208 and having source/drain regions 108 and a channel region 110 disposed upon it; a gate stack 112 disposed on the sheet layer 204; contacts 1702 electrically coupling the gate stack 112 and the source/drain regions 108 to other active and passive devices of the workpiece 5200, and/or collets 1704, where each is substantially similar to that of FIG. 23.

Referring to FIG. 60, in an exemplary embodiment, the workpiece 5200 undergoes the process of blocks 1802-1810 of FIG. 18 to produce a double gate FinFET 1902 implemented as a single transistor. In many respects, the double gate FinFET device 1902 is substantially similar to that described in the context of FIG. 24. For example, the double gate FinFET device 1902 of FIG. 60 includes a sheet layer 204 disposed on the rib structure 208 and having source/drain regions 108 and a channel region 110 disposed upon it; a gate stack 112 disposed on the sheet layer 204; contacts 1702 electrically coupling the gate stack 112 and the source/drain regions 108 to other active and passive devices of the workpiece 5200, and/or collets 1704, where each is substantially similar to that of FIG. 24.

Figure 61:
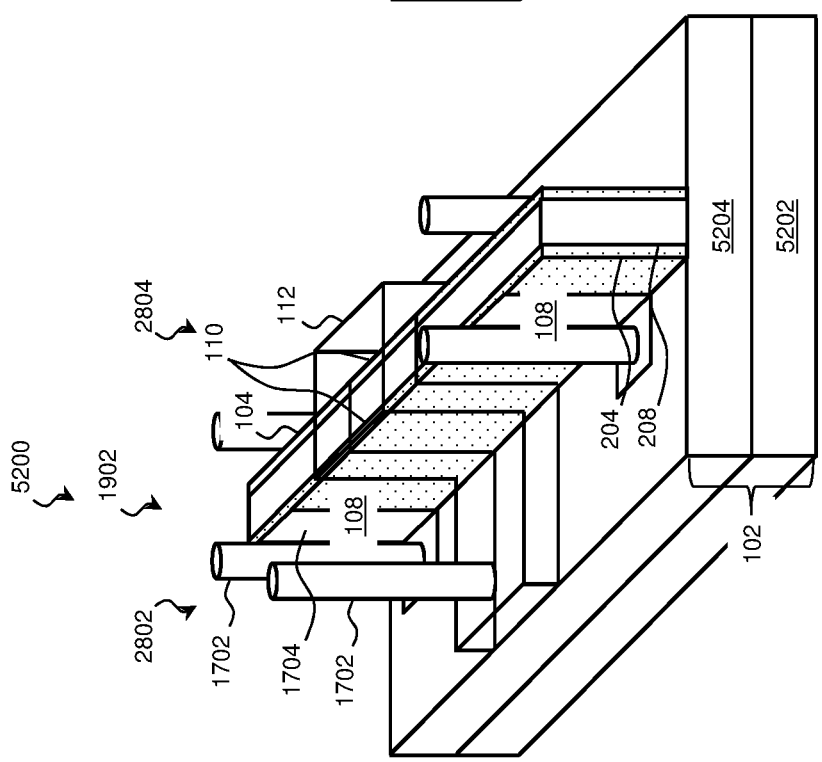

Referring to FIG. 61, in an exemplary embodiment, the workpiece 5200 undergoes the process of blocks 2502-2506 of FIG. 25 to produce a double gate FinFET 1902 implemented as two independent transistors (transistors 2802 and 2804). In many respects, the double gate FinFET device 1902 is substantially similar to that described in the context of FIG. 28. For example, the double gate FinFET device 1902 of FIG. 61 includes a sheet layer 204 disposed on the rib structure 208 and having source/drain regions 108 and a channel region 110 disposed upon it; a gate stack 112 disposed on the sheet layer 204; contacts 1702 electrically coupling the gate stack 112 and the source/drain regions 108 to other active and passive devices of the workpiece 5200, and/or collets 1704, where each is substantially similar to that of FIG. 28.

Figure 62:
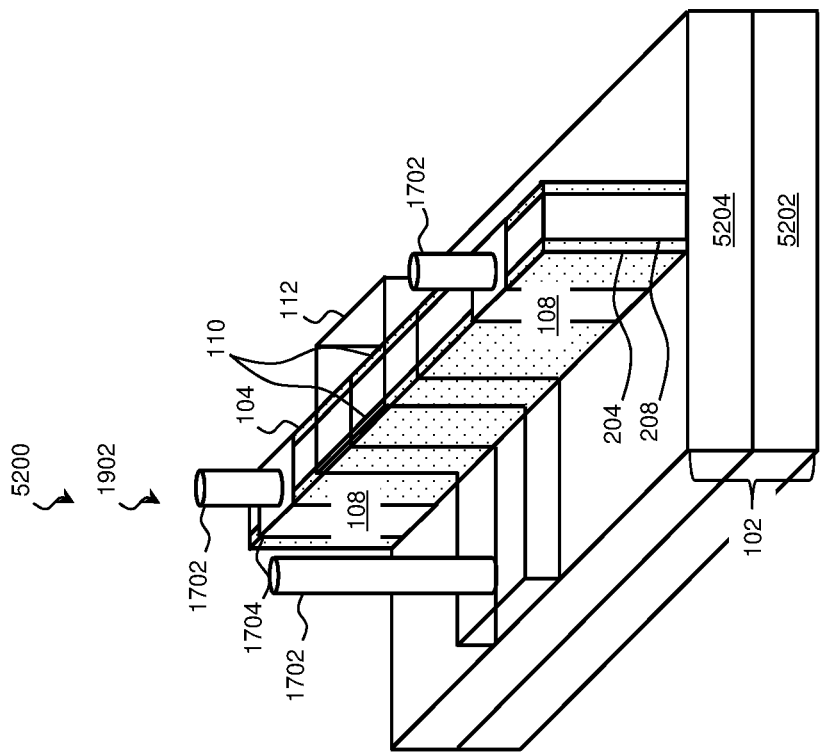

Referring to FIG. 62, in an exemplary embodiment, the workpiece 5200 undergoes the process of blocks 2502-2506 of FIG. 25 to produce a double gate FinFET 1902 implemented as a single transistor. In many respects, the double gate FinFET device 1902 is substantially similar to that described in the context of FIG. 29. For example, the double gate FinFET device 1902 of FIG. 62 includes a sheet layer 204 disposed on the rib structure 208 and having source/drain regions 108 and a channel region 110 disposed upon it; a gate stack 112 disposed on the sheet layer 204; contacts 1702 electrically coupling the gate stack 112 and the source/drain regions 108 to other active and passive devices of the workpiece 5200, and/or collets 1704, where each is substantially similar to that of FIG. 29.

Figure 63:
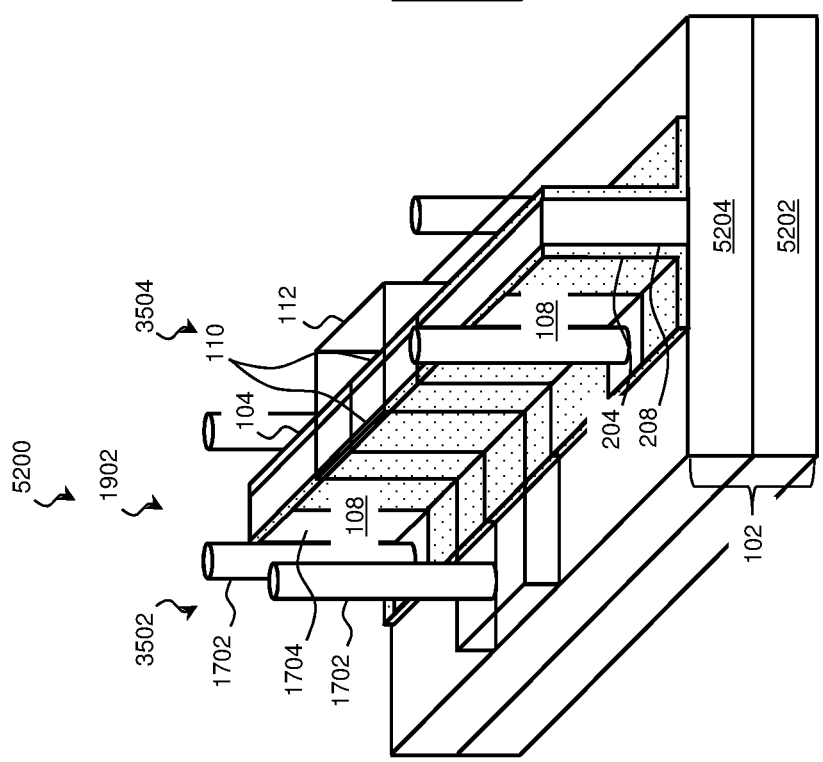

Referring to FIG. 63, in an exemplary embodiment, the workpiece 5200 undergoes the process of blocks 3002-3008 of FIG. 30 to produce a double gate FinFET 1902 implemented as two independent transistors (transistors 3502 and 3504). In many respects, the double gate FinFET device 1902 is substantially similar to that described in the context of FIG. 35. For example, the double gate FinFET device 1902 of FIG. 63 includes a sheet layer 204 disposed on the rib structure 208 and having source/drain regions 108 and a channel region 110 disposed upon it; a gate stack 112 disposed on the sheet layer 204; contacts 1702 electrically coupling the gate stack 112 and the source/drain regions 108 to other active and passive devices of the workpiece 5200, and/or collets 1704, where each is substantially similar to that of FIG. 35.

Figure 64:
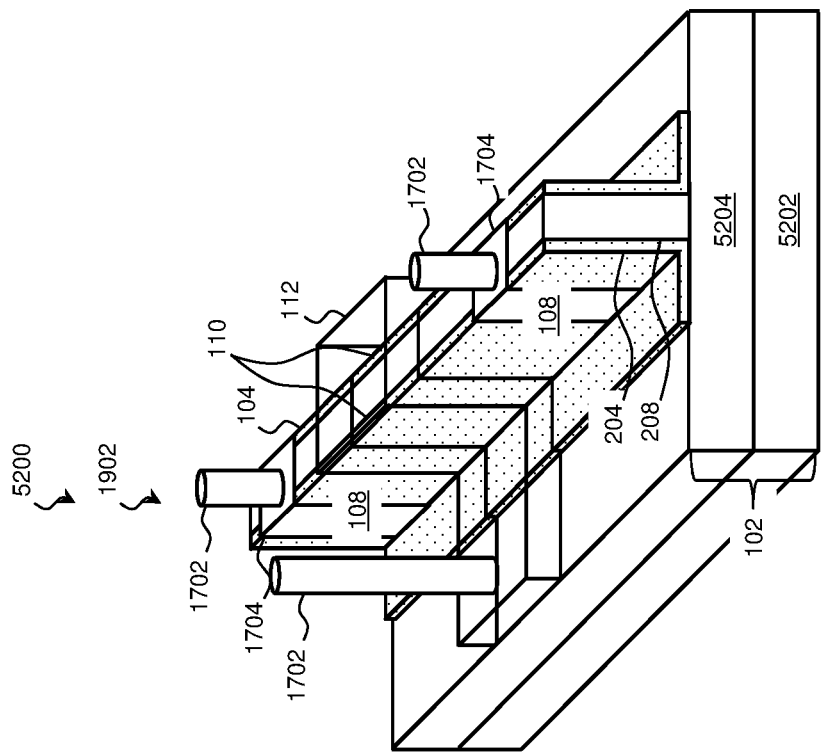

Referring to FIG. 64, in an exemplary embodiment, the workpiece 5200 undergoes the process of blocks 3002-3008 of FIG. 30 to produce a double gate FinFET 1902 implemented as a single transistor. In many respects, the double gate FinFET device 1902 is substantially similar to that described in the context of FIG. 36. For example, the double gate FinFET device 1902 of FIG. 64 includes a sheet layer 204 disposed on the rib structure 208 and having source/drain regions 108 and a channel region 110 disposed upon it; a gate stack 112 disposed on the sheet layer 204; contacts 1702 electrically coupling the gate stack 112 and the source/drain regions 108 to other active and passive devices of the workpiece 5200, and/or collets 1704, where each is substantially similar to that of FIG. 36.

Figure 65:
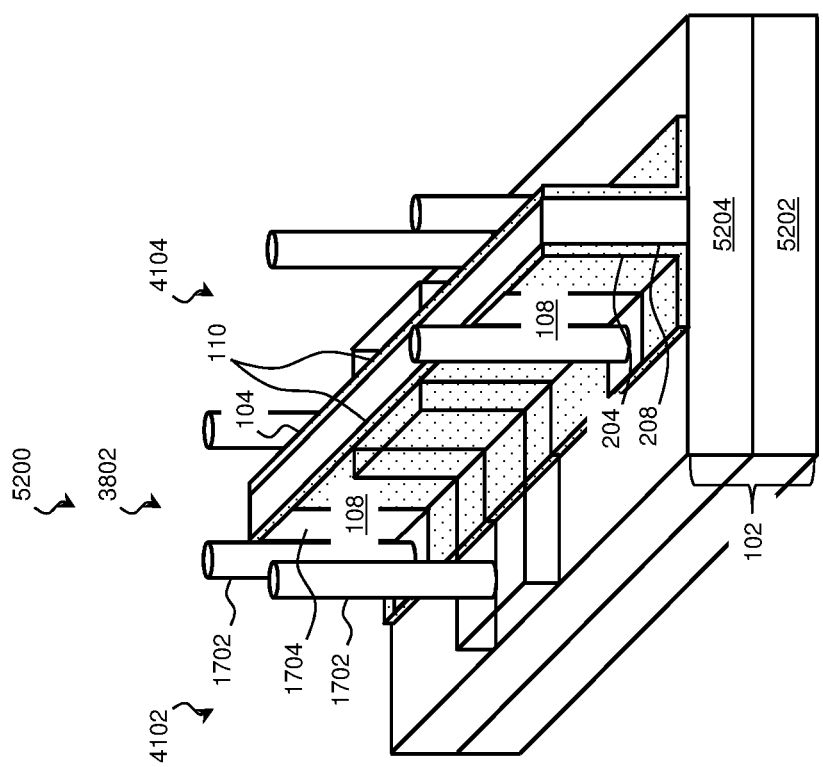

Referring to FIG. 65, in an exemplary embodiment, the workpiece 5200 undergoes the process of blocks 3702-3710 of FIG. 37 to produce a double-device FinFET 3802 that includes two independent transistors (transistors 4102 and 4104). In many respects, the double-device FinFET 3802 is substantially similar to that described in the context of FIG. 41. For example, the double-device FinFET 3802 of FIG. 65 includes a sheet layer 204 disposed on the rib structure 208 and having source/drain regions 108 and a channel region 110 disposed upon it; a gate stack 112 disposed on the sheet layer 204; contacts 1702 electrically coupling the gate stack 112 and the source/drain regions 108 to other active and passive devices of the workpiece 5200, and/or collets 1704, where each is substantially similar to that of FIG. 41.

Figure 66:
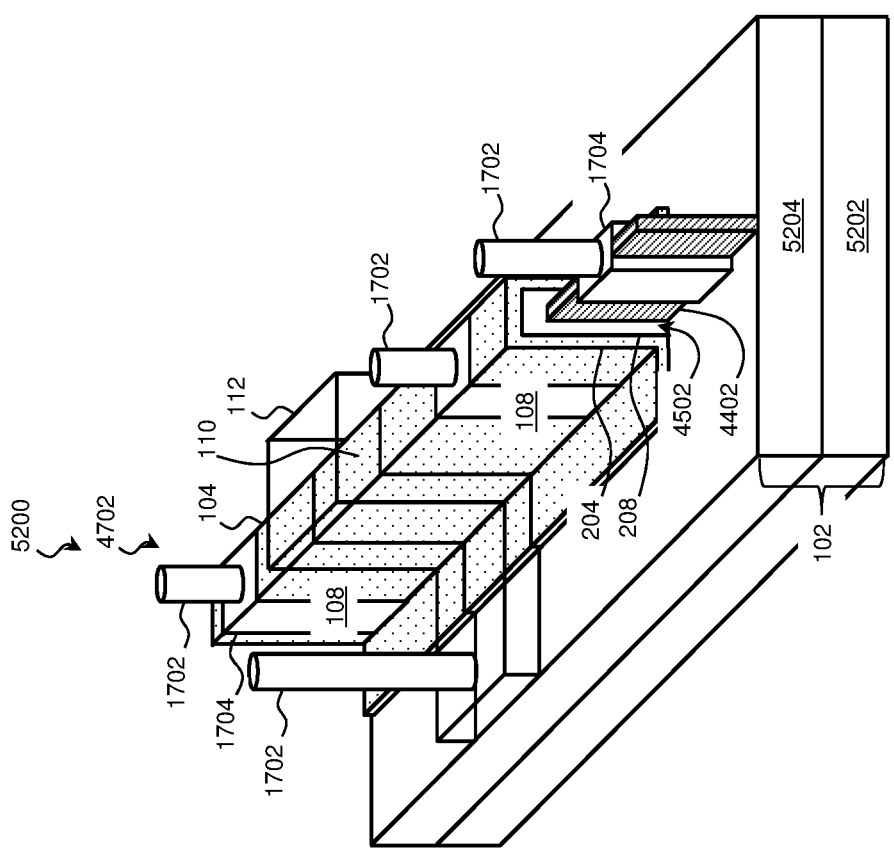

Referring to FIG. 66, in an exemplary embodiment, the workpiece 5200 undergoes the process of blocks 4202-4210 of FIG. 42 and blocks 518-524 of FIG. 5 to form a trigate FinFET 106. In many respects, the trigate FinFET 106 is substantially similar to that described in the context of FIG. 47. For example, the trigate FinFET 106 of FIG. 66 includes a rib structure having a gate electrode layer 4402 and one or more gate dielectric layers 4502, a sheet layer 204 disposed on the rib structure 208 and having source/drain regions 108 and a channel region 110 disposed upon it; a gate stack 112 disposed on the sheet layer 204; contacts 1702 electrically coupling the gate stack 112, the source/drain regions 108, and the gate electrode layer 4402 to other active and passive devices of the workpiece 5200, and/or collets 1704, where each is substantially similar to that of FIG. 47.

Figure 67:
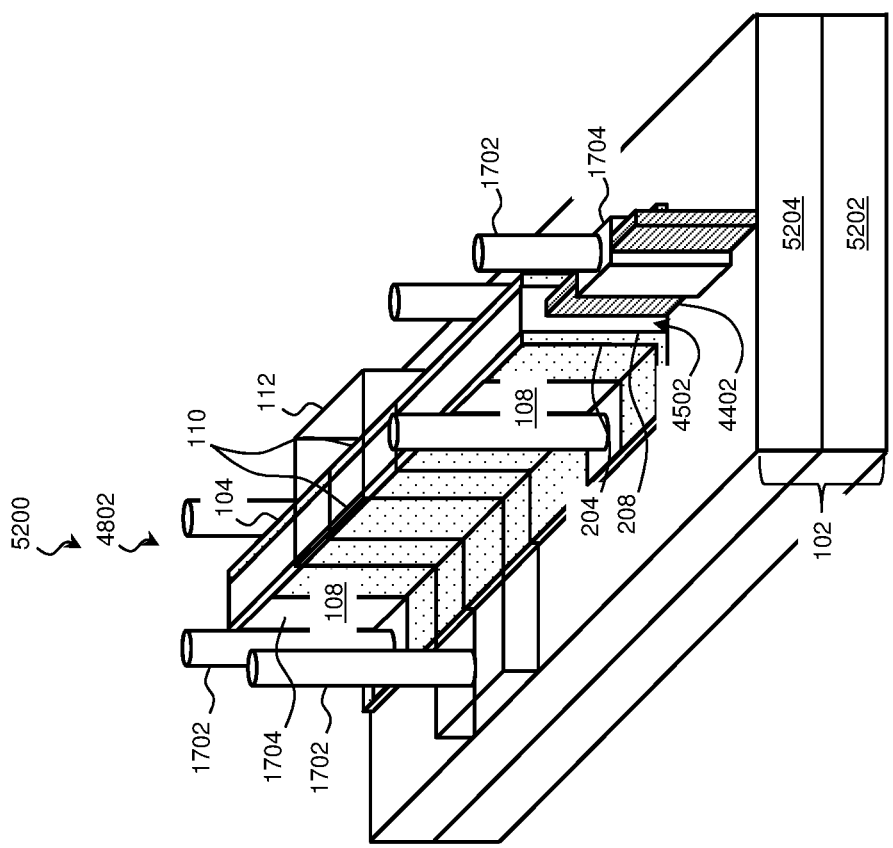

Referring to FIG. 67, in an exemplary embodiment, the workpiece 5200 undergoes the process of blocks 4202-4210 of FIG. 42 and a fabrication process such as that of blocks 1802-1810 of FIG. 18, blocks 2502-2506 of FIG. 25, and/or blocks 3002-3008 of FIG. 30 to form a double gate FinFET device 4802 implemented as two independent transistors. In many respects, the double gate FinFET device 4802 is substantially similar to that described in the context of FIG. 48. For example, the double gate FinFET device 4802 of FIG. 67 includes a rib structure having a gate electrode layer 4402 and one or more gate dielectric layers 4502, a sheet layer 204 disposed on the rib structure 208 and having source/drain regions 108 and a channel region 110 disposed upon it; a gate stack 112 disposed on the sheet layer 204; contacts 1702 electrically coupling the gate stack 112, the source/drain regions 108, and the gate electrode layer 4402 to other active and passive devices of the workpiece 5200, and/or collets 1704, where each is substantially similar to that of FIG. 48.

Figure 68:
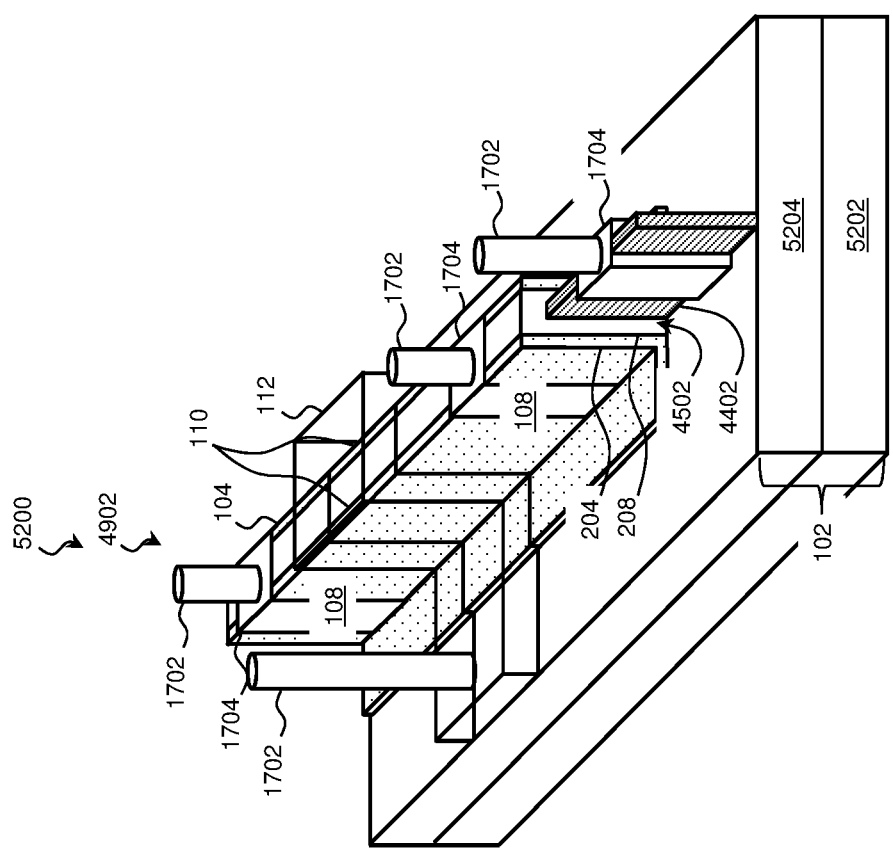

Referring to FIG. 68, in an exemplary embodiment, the workpiece 5200 undergoes the process of blocks 4202-4210 of FIG. 42 and a fabrication process such as that of blocks 1802-1810 of FIG. 18, blocks 2502-2506 of FIG. 25, and/or blocks 3002-3008 of FIG. 30 to form a double gate FinFET device 4902 implemented as a single transistor. In many respects, the double gate FinFET device 4902 is substantially similar to that described in the context of FIG. 49. For example, the double gate FinFET device 4902 of FIG. 68 includes a rib structure having a gate electrode layer 4402 and one or more gate dielectric layers 4502, a sheet layer 204 disposed on the rib structure 208 and having source/drain regions 108 and a channel region 110 disposed upon it; a gate stack 112 disposed on the sheet layer 204; contacts 1702 electrically coupling the gate stack 112, the source/drain regions 108, and the gate electrode layer 4402 to other active and passive devices of the workpiece 5200, and/or collets 1704, where each is substantially similar to that of FIG. 49.

Figure 69:
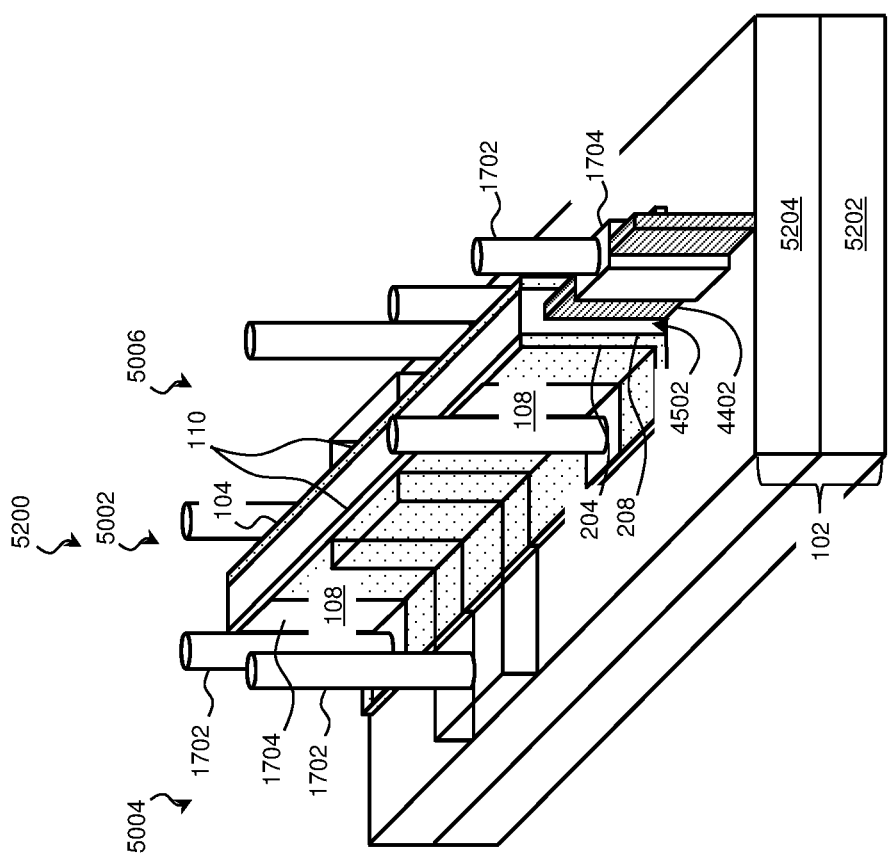

Finally, referring to FIG. 69, in an exemplary embodiment, the workpiece 5200 undergoes the process of blocks 4202-4210 of FIG. 42 and 3702-3710 of FIG. 37 to form a double-device FinFET 5002 that includes transistors 5004 and 5006. In many respects, the double-device FinFET 5002 is substantially similar to that described in the context of FIG. 50. For example, the double-device FinFET 5002 of FIG. 69 includes a rib structure having a gate electrode layer 4402 and one or more gate dielectric layers 4502, a sheet layer 204 disposed on the rib structure 208 and having source/drain regions 108 and a channel region 110 disposed upon it; a gate stack 112 disposed on the sheet layer 204; contacts 1702 electrically coupling the gate stack 112, the source/drain regions 108, and the gate electrode layer 4402 to other active and passive devices of the workpiece 5200, and/or collets 1704, where each is substantially similar to that of FIG. 50.

Thus, the present disclosure provides a thin-sheet non-planar circuit device such as a FinFET and a method for forming the device. In some exemplary embodiments, a semiconductor device is provided that includes a substrate having a top surface defined thereupon, a feature disposed on the substrate and extending above the top surface, and a material layer disposed on the feature. The material layer has a plurality of source/drain regions and a channel region disposed between the source/drain regions. The semiconductor device also includes a gate stack disposed on the channel region of the material layer. In one such embodiment, the material layer includes at least one of graphene and a transition metal dichalcogenide compound.

In further embodiments, a circuit device is provided that includes a fin formed on a substrate and having a transistor formed thereupon. In turn, the fin includes a rib structure and a sheet material formed on at least one surface of the rib structure. The sheet material has a channel region of the transistor defined thereupon, and the circuit device also includes a gate formed over the channel region of the sheet material. In one such embodiment, the rib structure includes a top surface and opposing side surfaces, and the sheet material is formed on at least the opposing side surfaces of the rib structure.

In yet further embodiments, a method of fabricating a semiconductor device is provided that includes: receiving a substrate having a feature formed thereupon, wherein the feature extends upward from a top surface of the substrate; forming a material layer on the feature and on the top surface of the substrate; removing a portion of the material layer formed on the top surface of the substrate; and forming a gate stack over the material layer. In one such embodiment, the removing of the portion of the material layer is configured to control a channel width of a transistor formed by the material layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   receiving a substrate having a semiconductor feature formed thereupon, wherein the semiconductor feature extends upward from a top surface of the substrate;
   forming a two-dimensional material layer on the semiconductor feature and on the top surface of the substrate, wherein a channel region, a source region, and a drain region are defined in the two-dimensional material layer, the channel region being disposed between the source region and the drain region;
   removing a portion of the two-dimensional material layer from over the semiconductor feature to thereby expose a portion of the semiconductor feature; and
   after removing the portion of the two-dimensional material layer, forming a gate stack over the channel region of the two-dimensional material layer and directly on the portion of the semiconductor feature such that the gate stack physically contacts the portion of the semiconductor feature.

2. The method of claim 1, wherein the forming of the two-dimensional material layer includes forming the two-dimensional material layer to include graphene.

3. The method of claim 1, wherein the forming of the two-dimensional material layer includes forming the two-dimensional material layer to include transition metal dichalcogenide.

4. The method of claim 1, wherein the portion of the two-dimensional material layer is a second portion, the method further comprising removing a first portion of the two-dimensional material layer disposed over the substrate, wherein the second portion is disposed on a top surface of the semiconductor feature.

5. The method of claim 4, wherein the removing the second portion includes:
   forming a planarization layer over the substrate, such that the two-dimensional material layer disposed on the top surface of the semiconductor feature is exposed; and
   performing a chemical mechanical polishing process to remove the exposed two-dimensional material layer.

6. The method of claim 4, wherein the removing the second portion includes:
   forming a planarization layer over the substrate, such that the two-dimensional material layer disposed on the top surface of the semiconductor feature is exposed; and
   performing an etching process to remove the exposed two-dimensional material layer.

7. The method of claim 4, wherein the removing the first portion and the second portion includes:
   forming spacers over the two-dimensional material layer along sidewalls of the semiconductor feature; and performing an etching process to remove an exposed portion of the two-dimensional material layer, wherein the exposed portion defines the first portion and the second portion.

8. The method of claim 1, wherein the portion of the two-dimensional material layer is disposed on a horizontal surface of the semiconductor feature.

9. The method of claim 8, wherein the removing the portion includes anisotropically etching the portion.

10. The method of claim 1, wherein the removing of the portion of the two-dimensional material layer is configured to control a channel width of a transistor formed by the two-dimensional material layer.

11. A method comprising:
forming a semiconductor rib structure extending from a substrate, the semiconductor rib structure including a top surface facing away from the substrate;
forming a two-dimensional material layer on the semiconductor rib structure;
patterning the two-dimensional material layer, such that the two-dimensional material layer is disposed on at least one surface of the semiconductor rib structure, wherein the top surface of the of semiconductor rib structure is exposed after the patterning of the two-dimensional material layer; and
after patterning the two-dimensional material layer, forming a gate stack directly on the top surface of the semiconductor rib structure and the two-dimensional material layer.

12. The method of claim 11, wherein the forming the two-dimensional material layer includes forming at least one monolayer of transition metal dichalcogenide or graphene.

13. The method of claim 11, wherein the forming the gate includes:
forming a gate material layer over the two-dimensional material layer; and
removing the gate material layer from over a source region and a drain region defined in the two-dimensional material layer.

14. The method of claim 11, wherein the forming the semiconductor rib structure includes:
recessing an area of the substrate to define an extension portion of the substrate; and
forming isolation features over the substrate, such that the extension portion of the substrate is disposed between isolation features.

15. The method of claim 14, further including replacing the extension portion of the substrate with a material extension portion.

16. The method of claim 15, wherein the replacing the extension portion of the substrate includes:
forming a fill layer over the substrate that exposes the extension portion of the substrate;
performing an etching process to remove the extension portion of the substrate, thereby forming a cavity in the fill layer;
filling the cavity with a semiconductor rib structure material; and
removing the fill layer.

17. A method comprising:
forming a semiconductor fin feature over a substrate, the semiconductor fin feature having a top surface facing away from the substrate;
forming at least one monolayer of a two-dimensional material on the semiconductor fin feature and the substrate, wherein the two-dimensional material includes transition metal dichalcogenide or graphene;
patterning the at least one monolayer of the two-dimensional material to define a channel width of a channel region defined in the at least one monolayer of the two-dimensional material;
after patterning the at least one monolayer of the two-dimensional material, forming a gate stack directly on the channel region defined in the patterned monolayer of the two-dimensional material such that the gate stack physically contacts the channel region defined in the patterned monolayer of the two-dimensional material, wherein the gate stack includes a gate electrode layer and a dielectric layer; and
after forming the gate stack, removing a portion of the channel region defined in the patterned monolayer of the two-dimensional material, a portion of the gate dielectric layer and a portion of the gate electrode layer to expose the top surface of the semiconductor fin feature.

18. The method of claim 17, wherein the patterning includes removing the at least one monolayer of the two-dimensional material disposed on a top surface of the substrate.

19. The method of claim 17, wherein the patterning includes using spacers as a masking element.

20. The method of claim 17, wherein the portion of the patterned monolayer of the two-dimensional material covers the portion of the top surface, and
wherein the portion of the gate dielectric layer interfaces with the portion of the patterned monolayer of the two-dimensional material, after the forming of the gates stack.

* * * * *